United States Patent [19]
Kasai et al.

[11] Patent Number: 5,946,570
[45] Date of Patent: Aug. 31, 1999

[54] PROCESS FOR FABRICATING SEMICONDUCTOR DEVICE HAVING SEMICONDUCTOR LAYERS EPITAXIALLY GROWN FROM ACTIVE AREAS WITHOUT SHORT-CIRCUIT ON FIELD INSULATING LAYER

[75] Inventors: Naoki Kasai; Hiromitsu Hada; Hidemitsu Mori; Toru Tatsumi, all of Tokyo, Japan

[73] Assignee: NEC Corporation, Tokyo, Japan

[21] Appl. No.: 08/974,996

[22] Filed: Nov. 20, 1997

[30] Foreign Application Priority Data

Nov. 21, 1996 [JP] Japan .................................. 8-310354

[51] Int. Cl.$^6$ .............................................. H01L 21/8242
[52] U.S. Cl. ........................................... 438/253; 438/413
[58] Field of Search ................................... 438/253, 396, 438/413, 416, 488

[56] References Cited

U.S. PATENT DOCUMENTS

| | | | |
|---|---|---|---|
| 5,025,741 | 6/1991 | Suwanai et al. | 438/253 |
| 5,030,587 | 7/1991 | Wald et al. | 438/253 |
| 5,091,330 | 2/1992 | Cambou et al. | 438/413 |
| 5,478,768 | 12/1995 | Iwasa | 438/253 |
| 5,627,094 | 5/1997 | Chan et al. | 438/253 |

FOREIGN PATENT DOCUMENTS 3-49259   3/1991   Japan .

OTHER PUBLICATIONS

H. Hada et al., "A Self–Aligned Contact Technology Using Anisotropical Selective Epitaxial Silicon For Giga–Bit DRAMs", *IEDM 95*, 1995, pp. 665–668.

*Primary Examiner*—Chandra Chaudhari
*Attorney, Agent, or Firm*—Sughrue, Mion, Zinn, Macpeak & Seas, PLLC

[57] ABSTRACT

A memory cell of a semiconductor dynamic random access memory device requires a bit line contact hole open to a drain region of a cell transistor for connecting a bit line to the drain region and a node contact hole open to a source region for connecting a storage electrode of a stacked capacitor to the source region, and the bit line contact hole and the node contact hole are plugged with silicon layers; the silicon layers are epitaxially grown from the source and drain regions over an oxide-encapsulated gate electrode of the cell transistor so as to increase the contact areas; and the silicon layers are firstly anisotropically grown until reaching the upper surface of the oxide-encapsulated gate electrode, and, thereafter, isotropically grown so as to increase the contact areas.

12 Claims, 32 Drawing Sheets

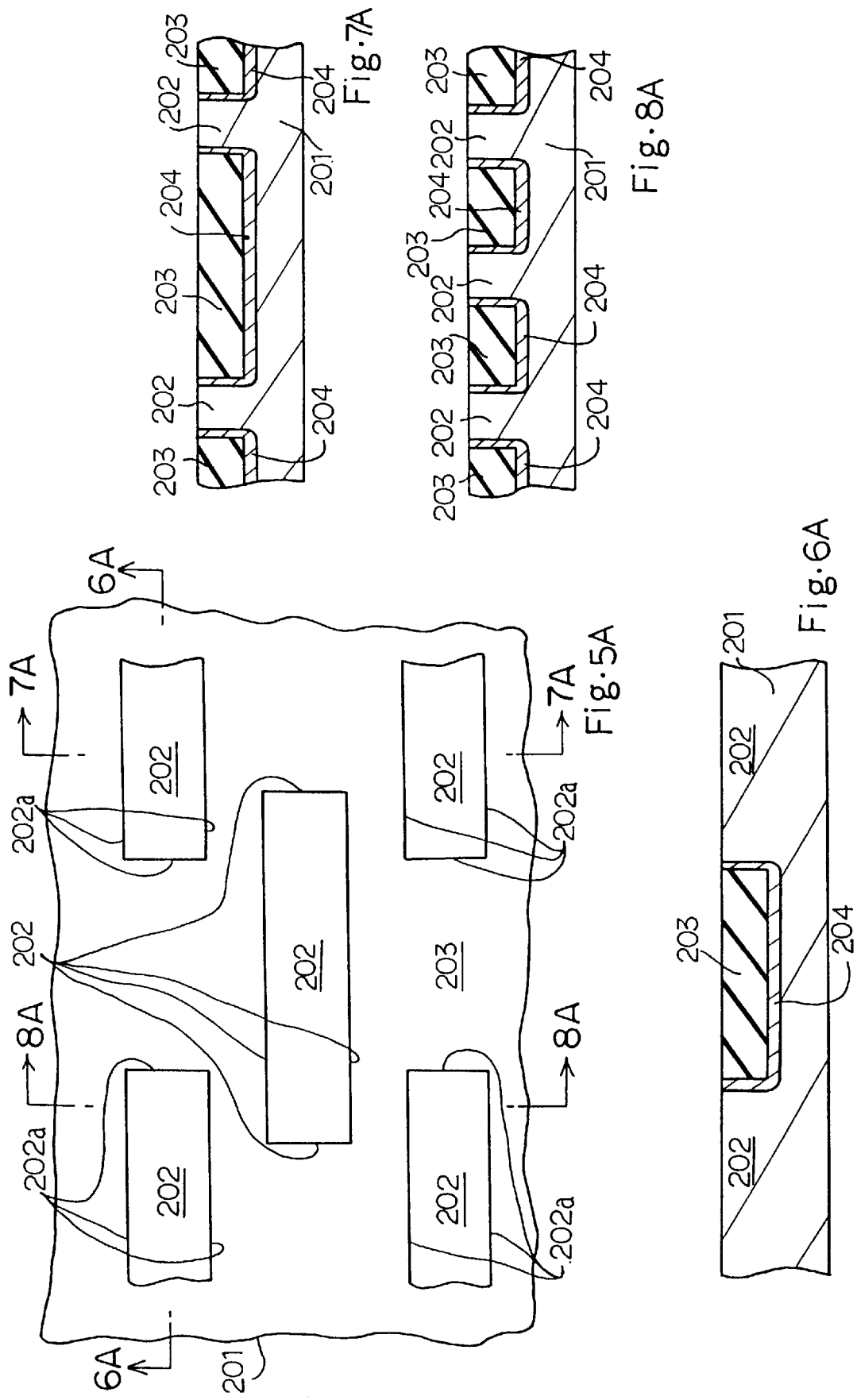

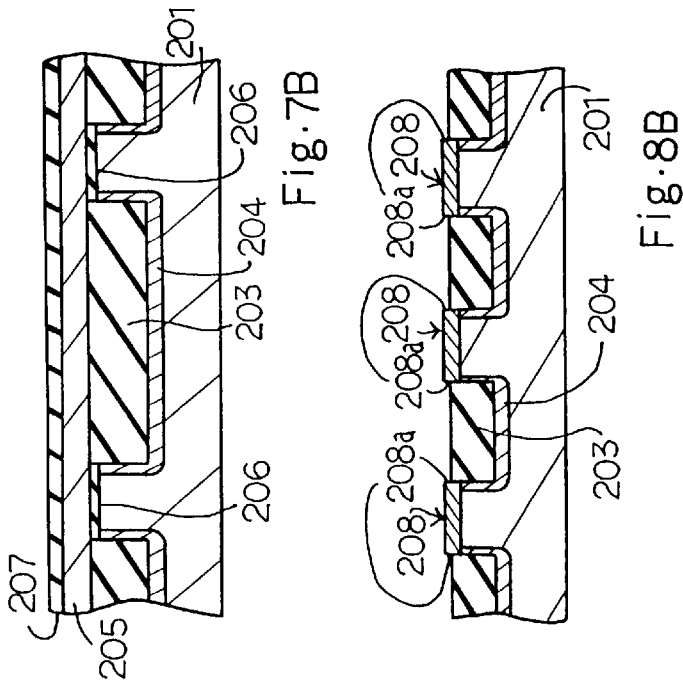
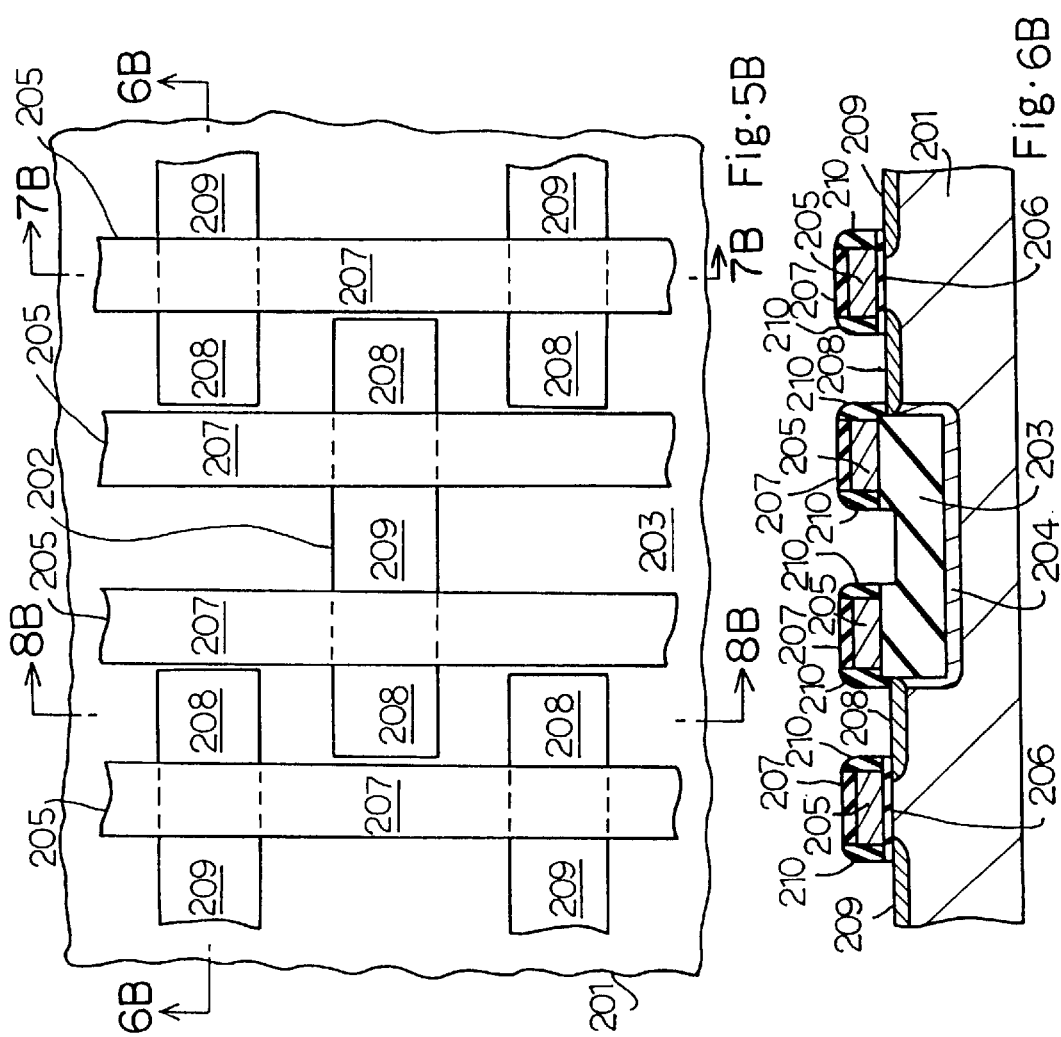

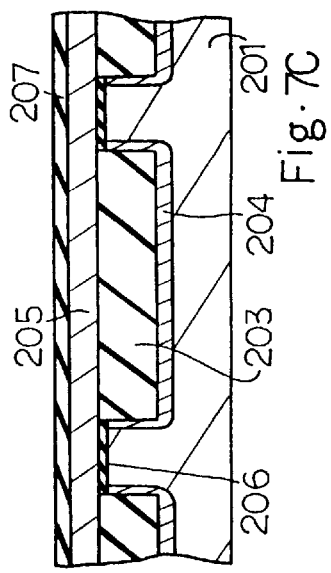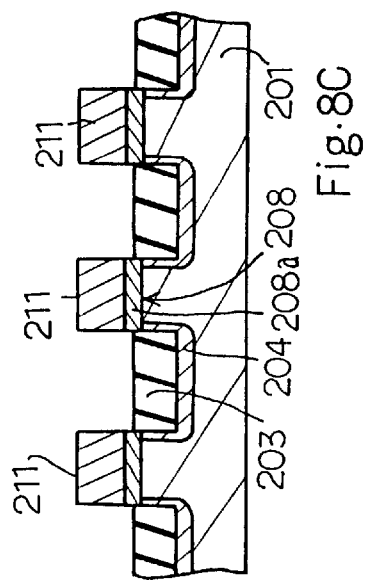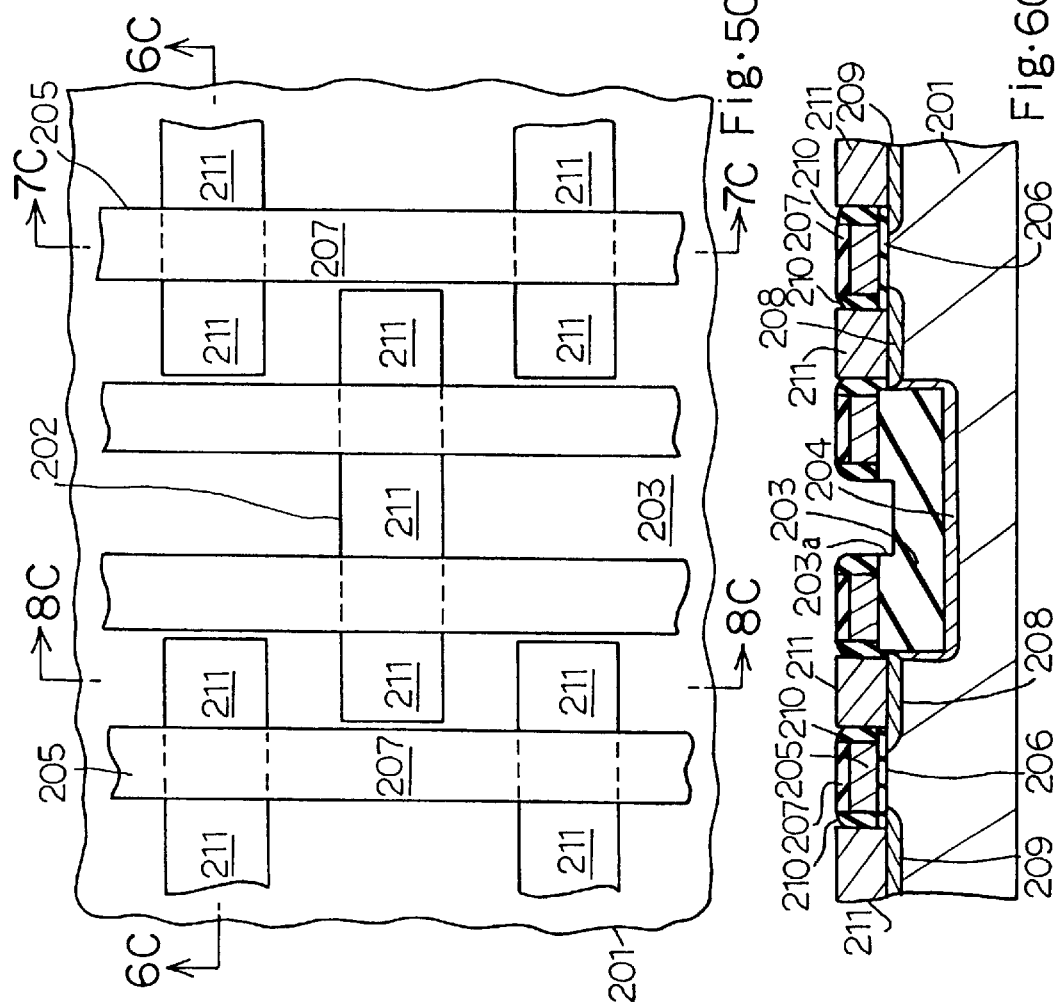

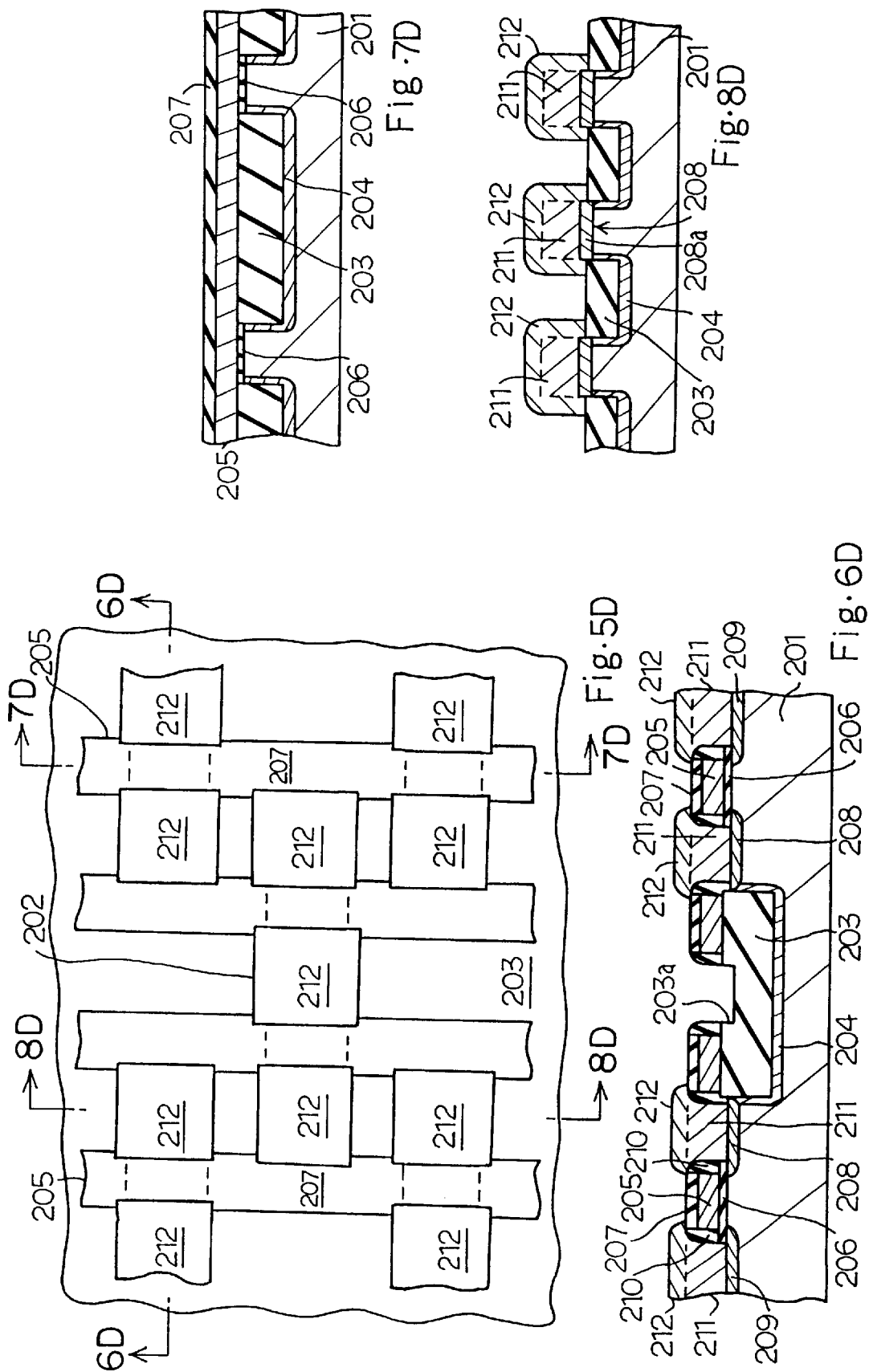

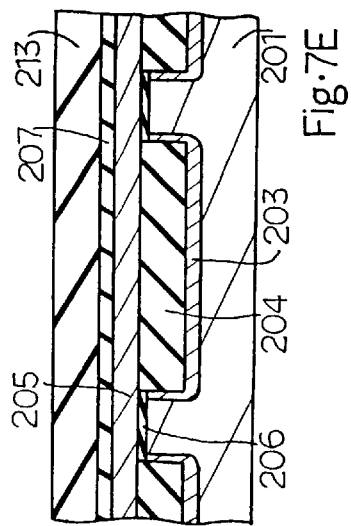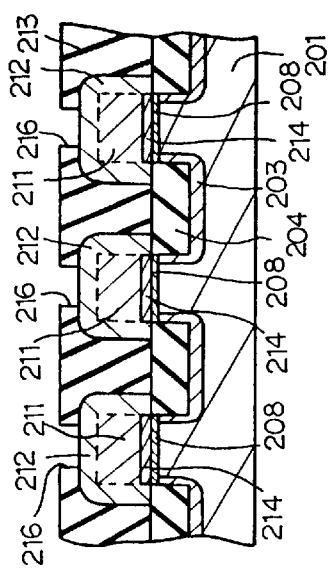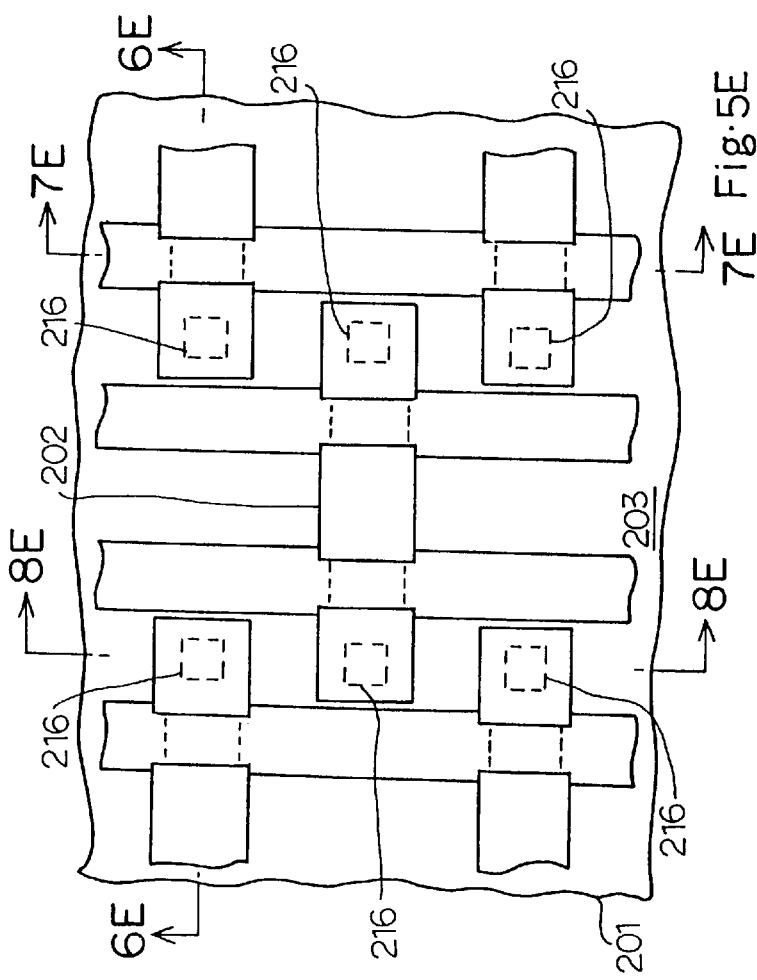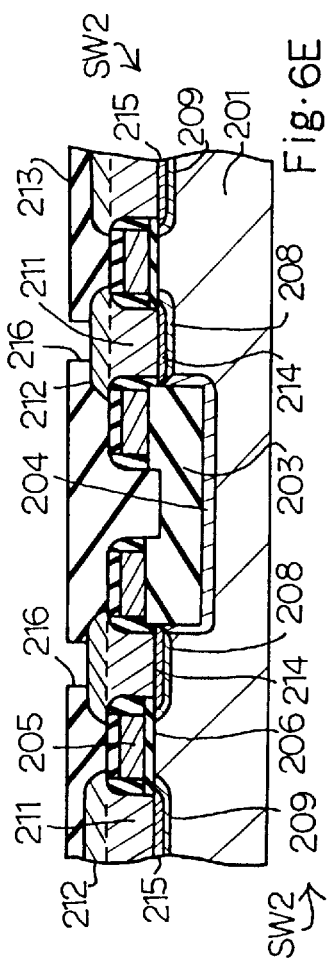

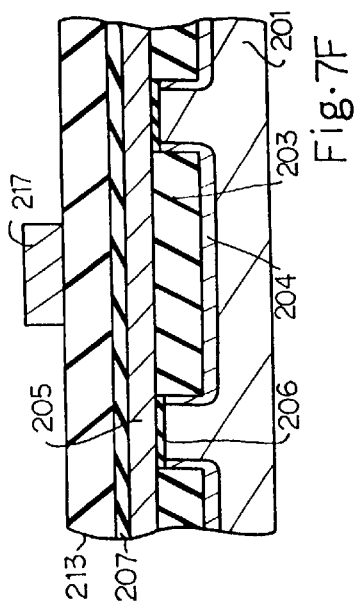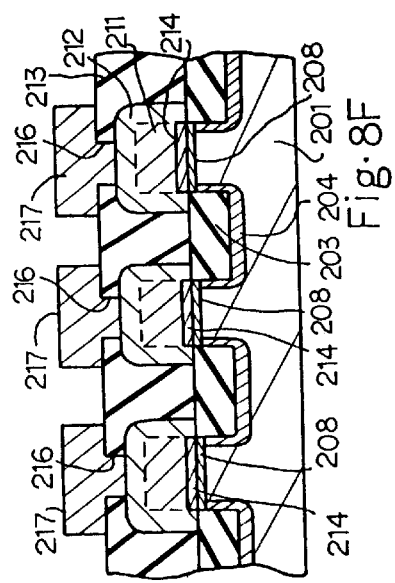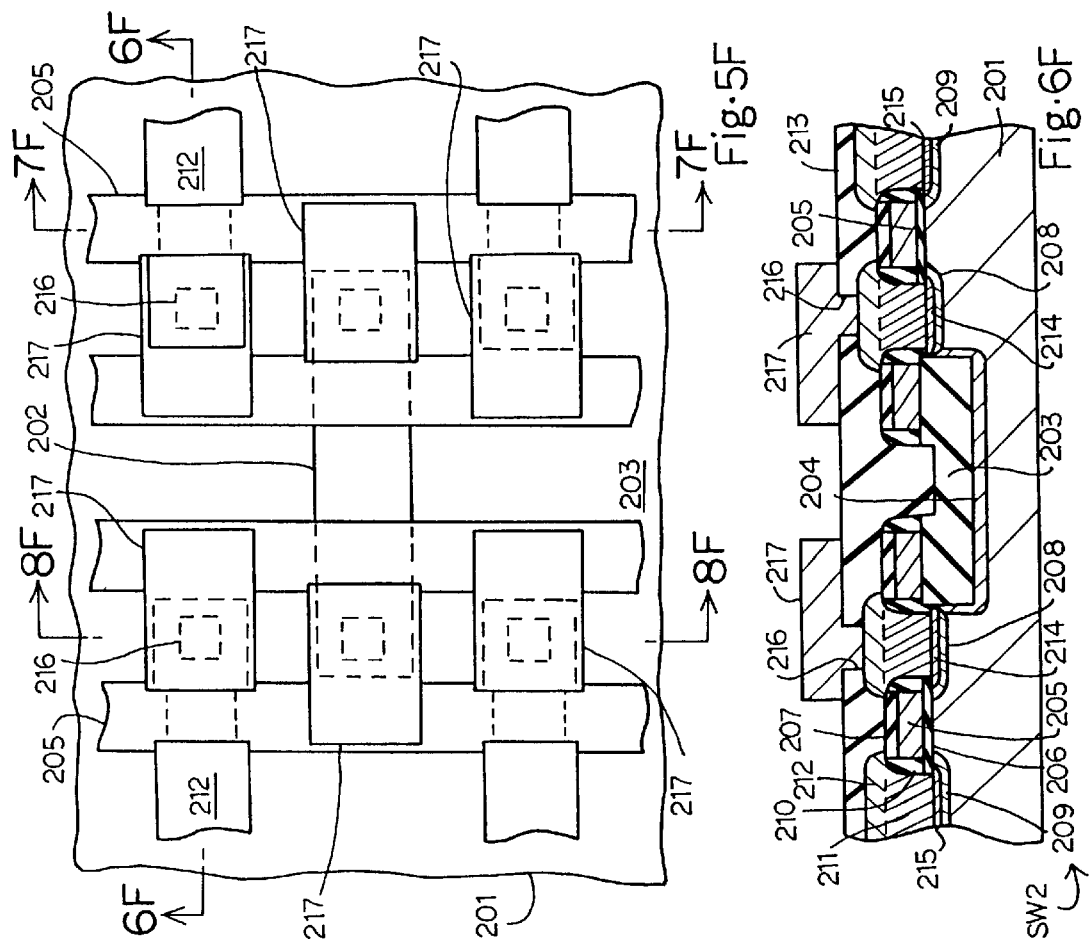

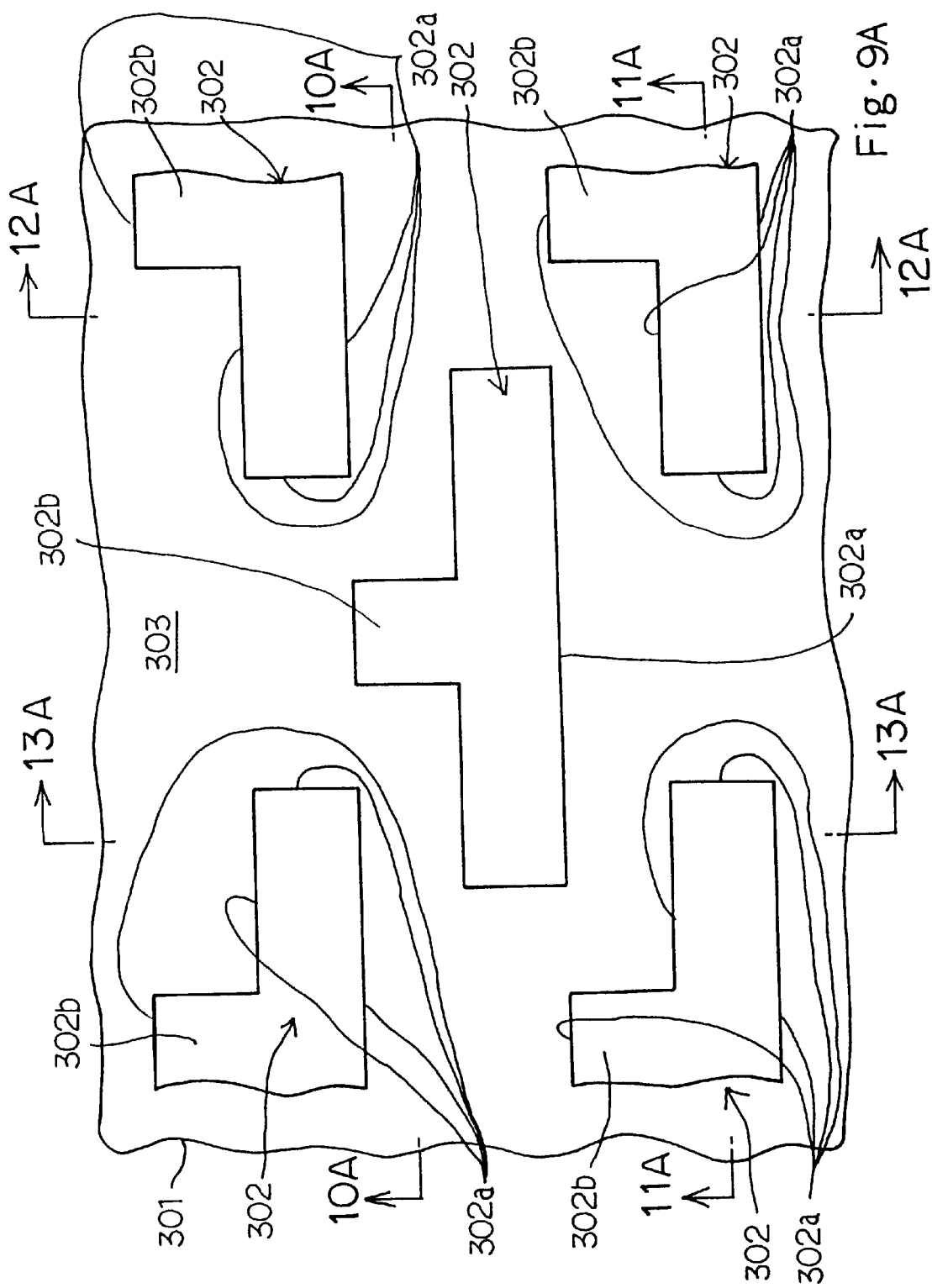

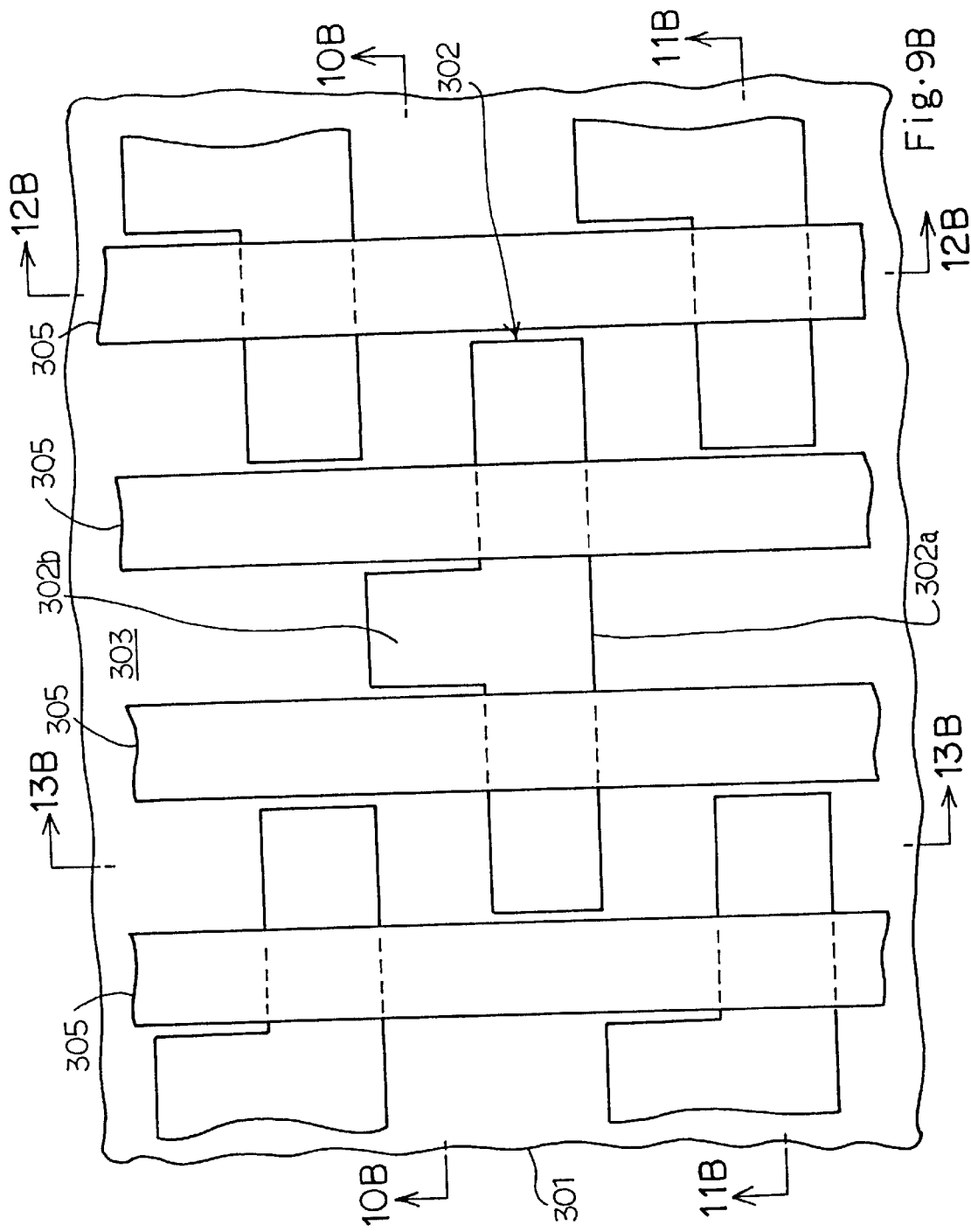

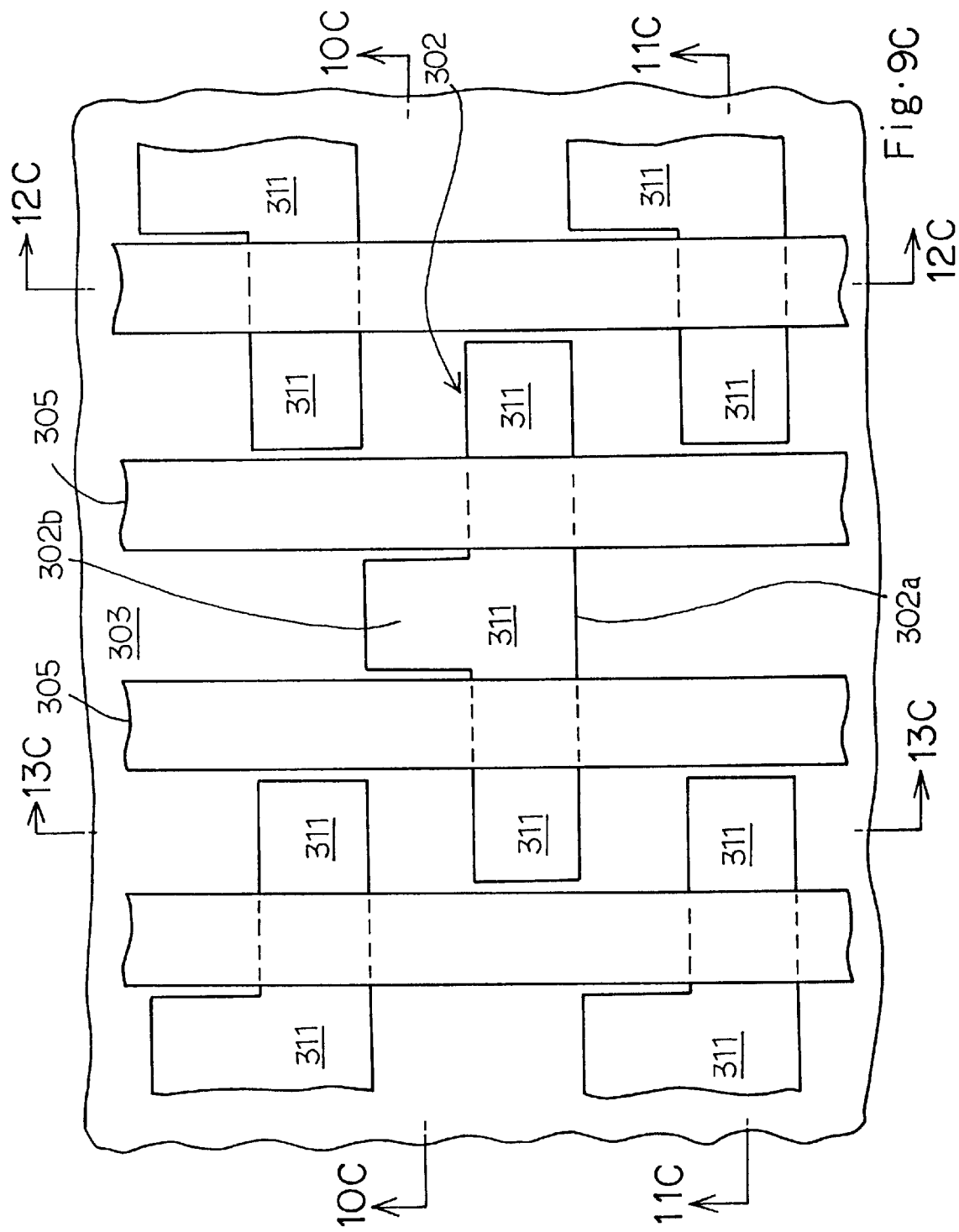

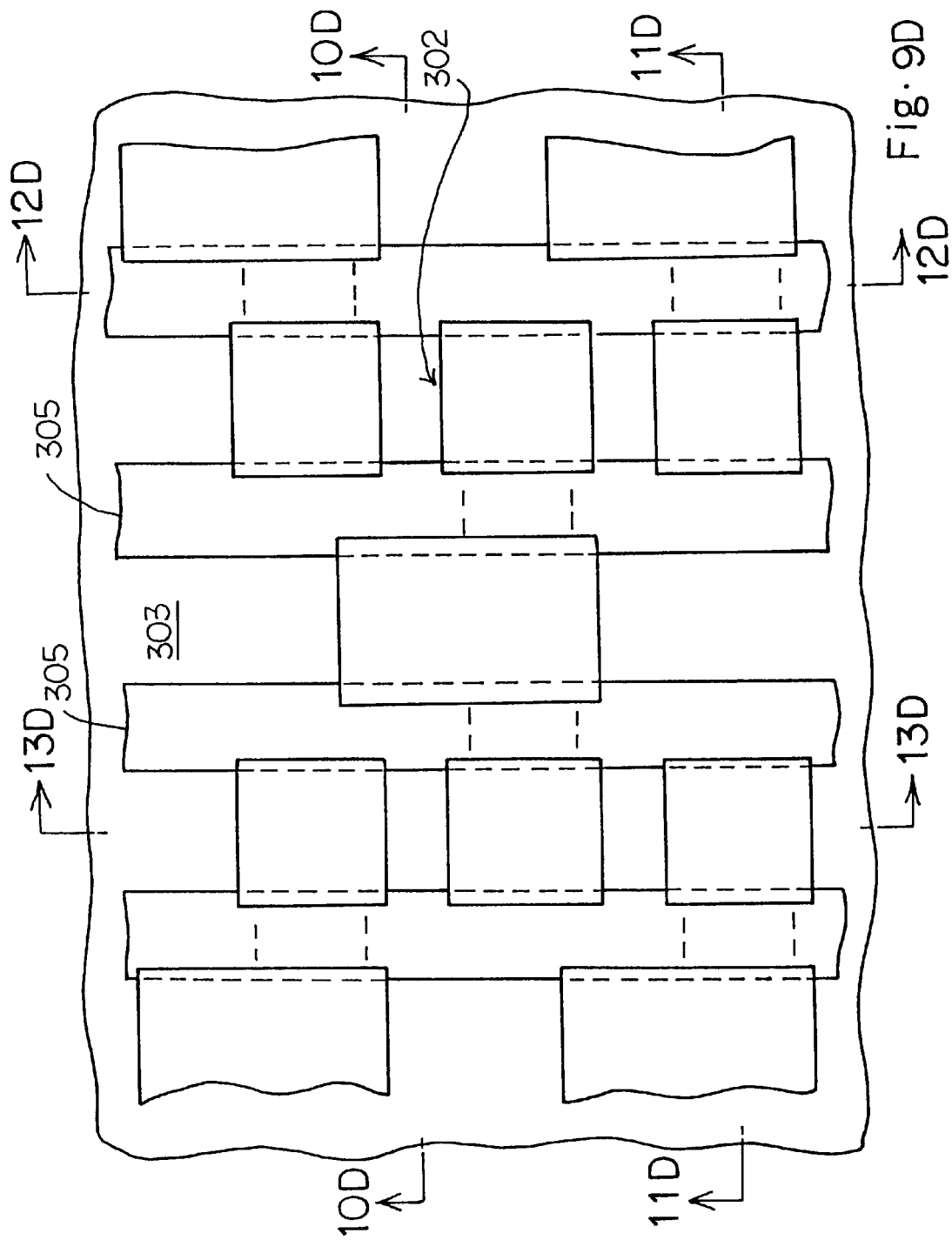

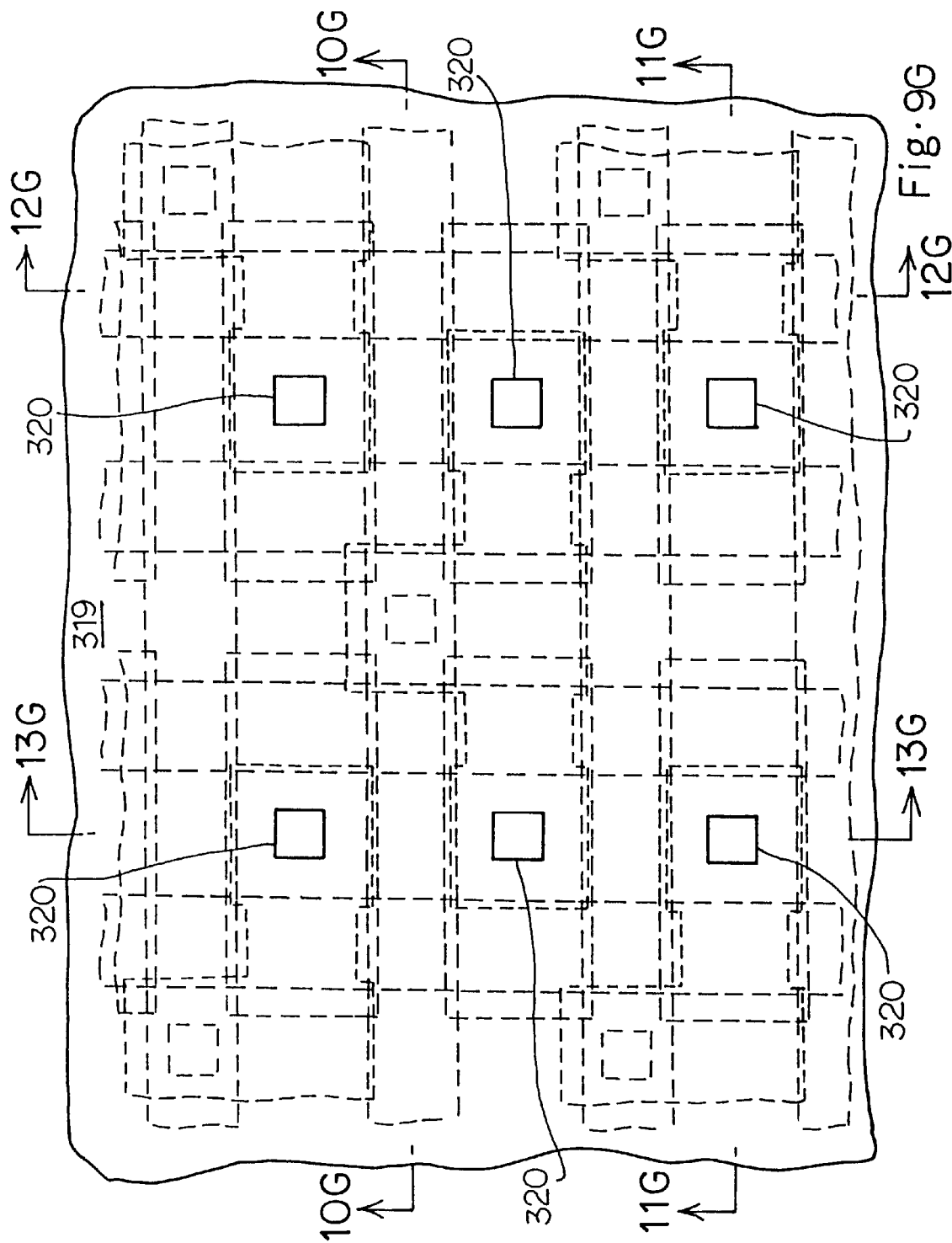

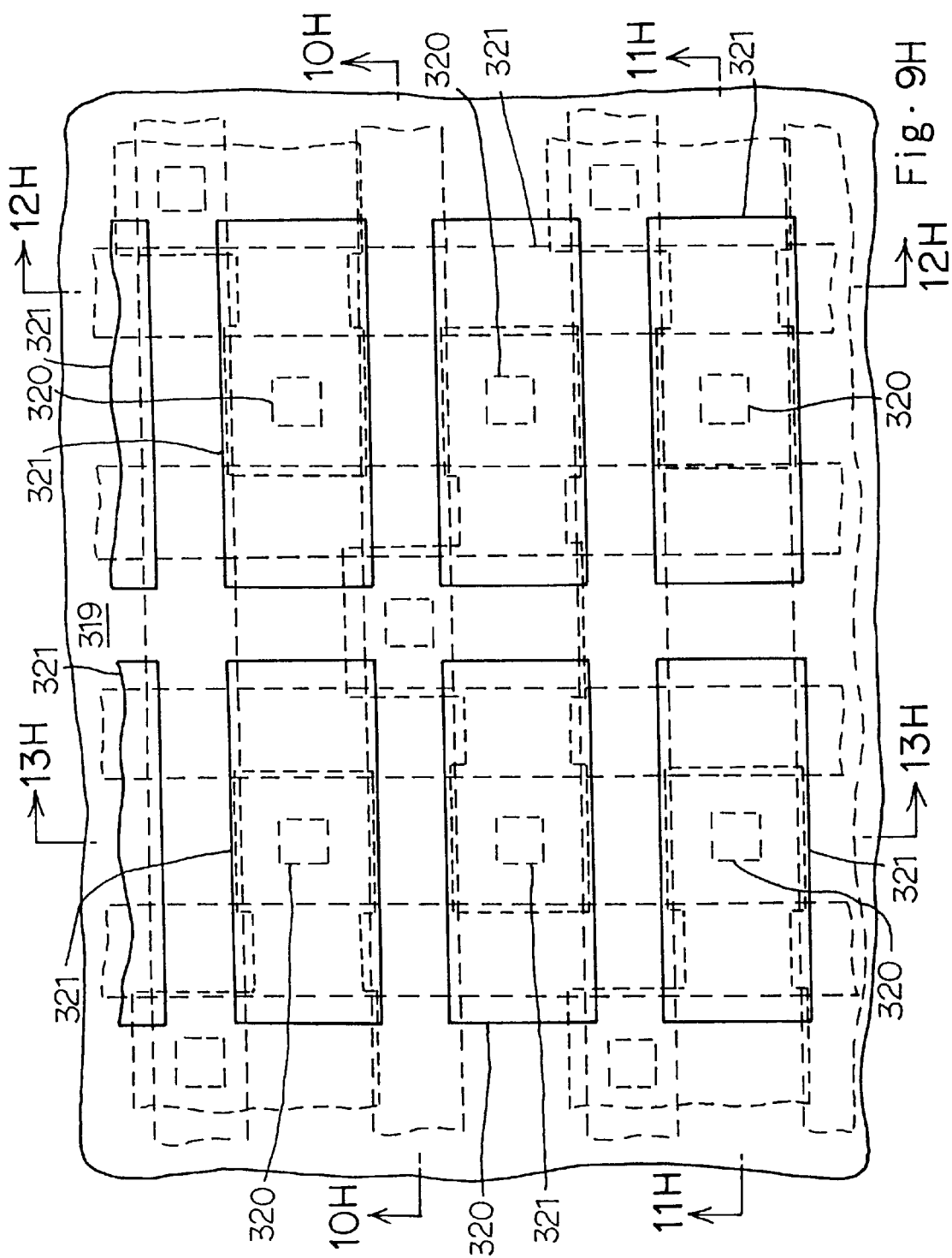

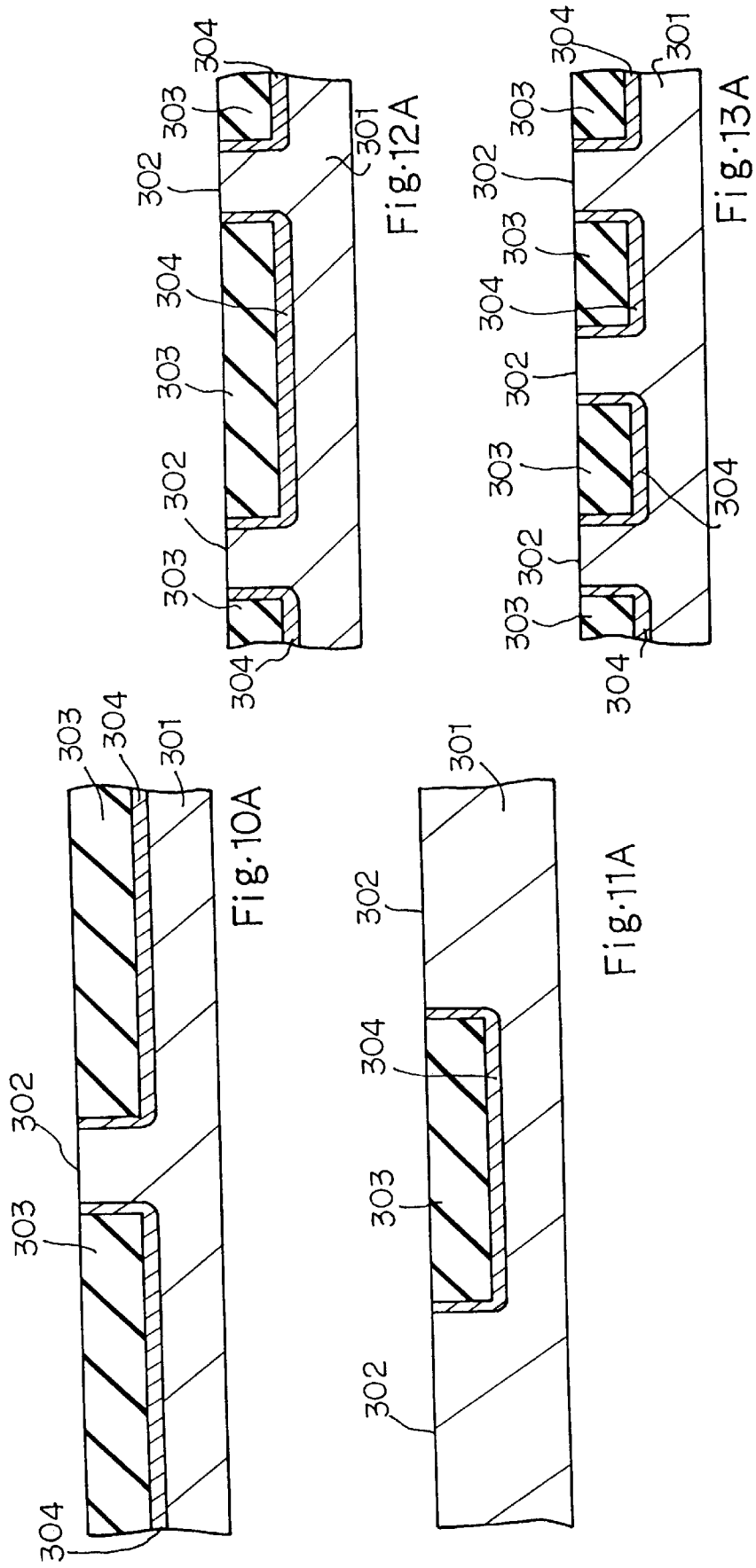

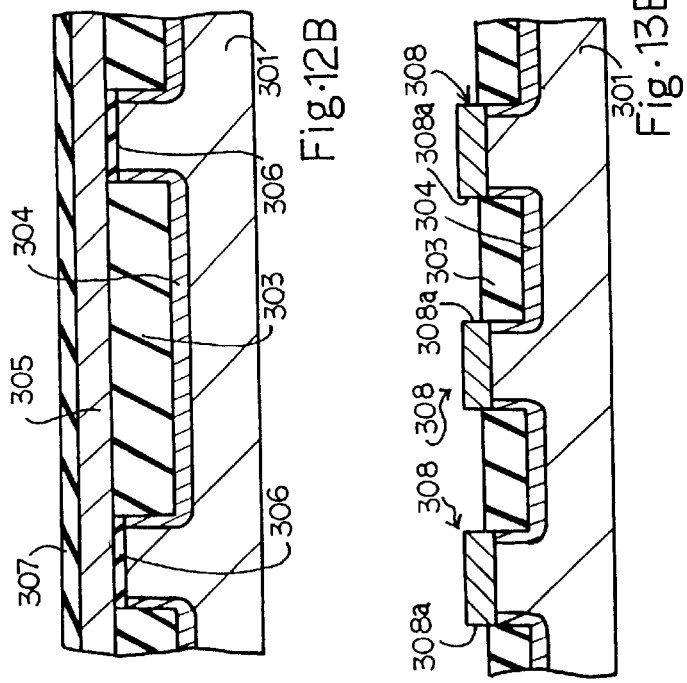

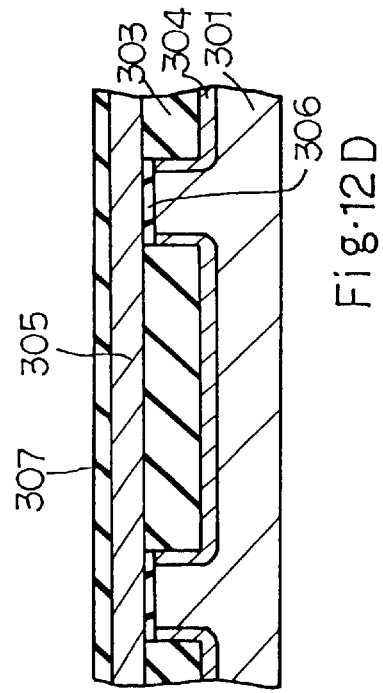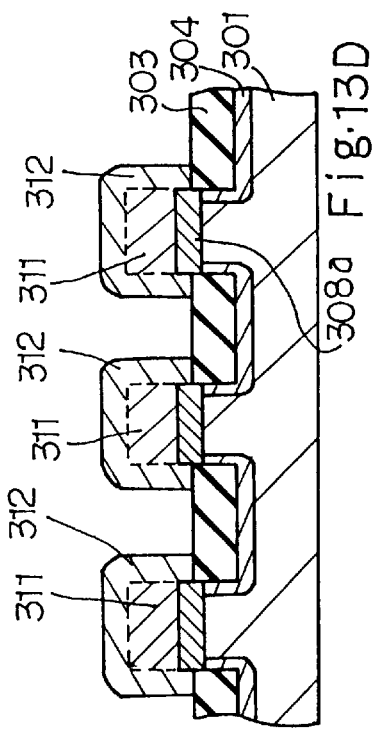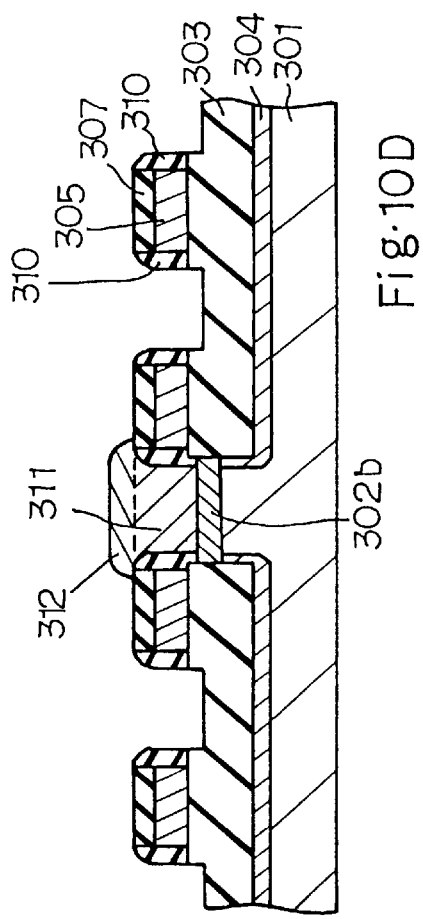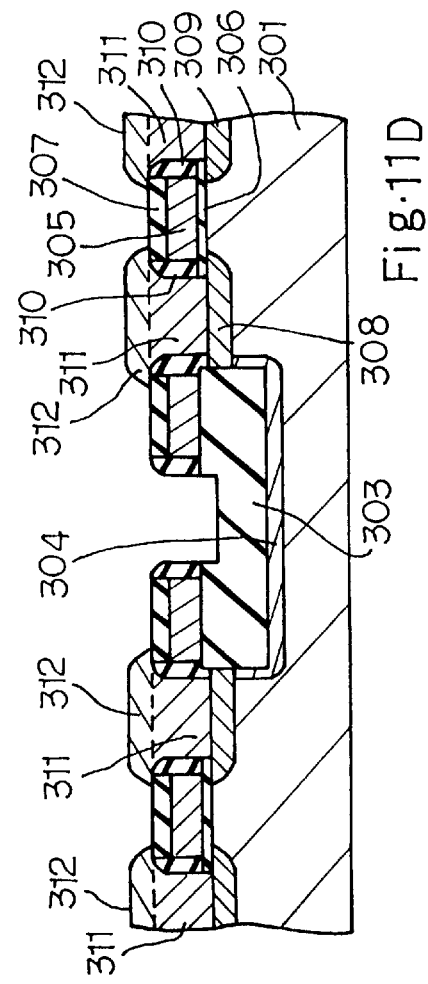

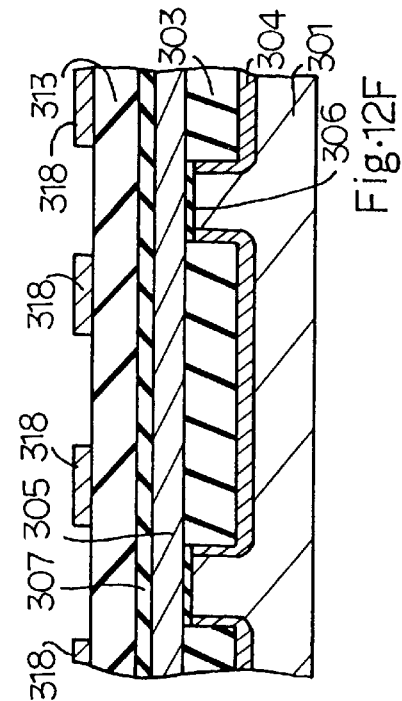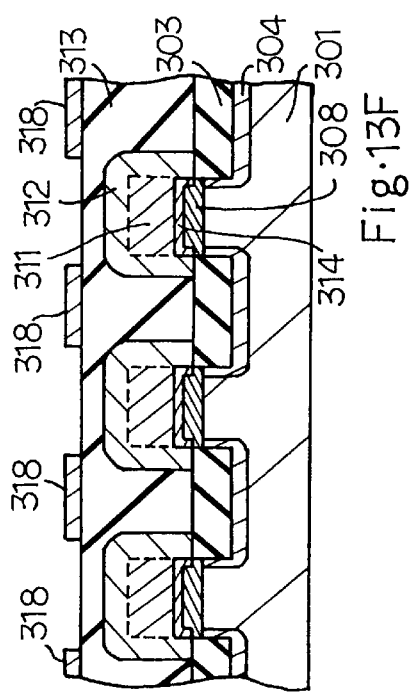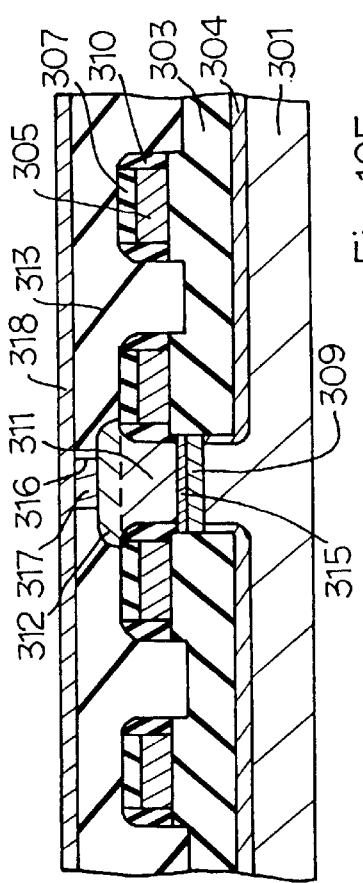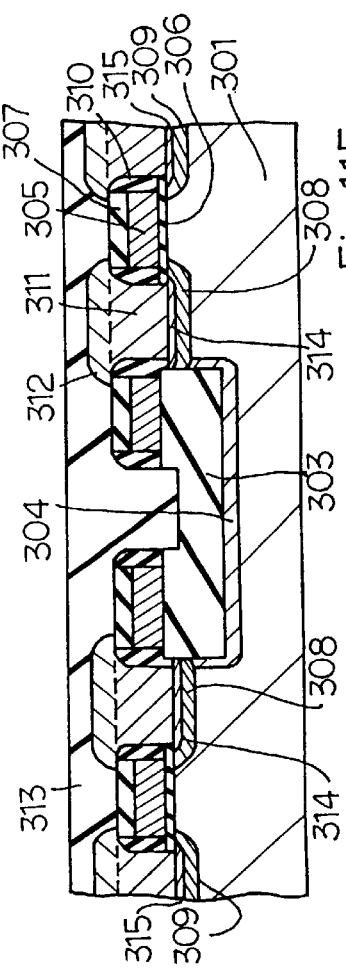

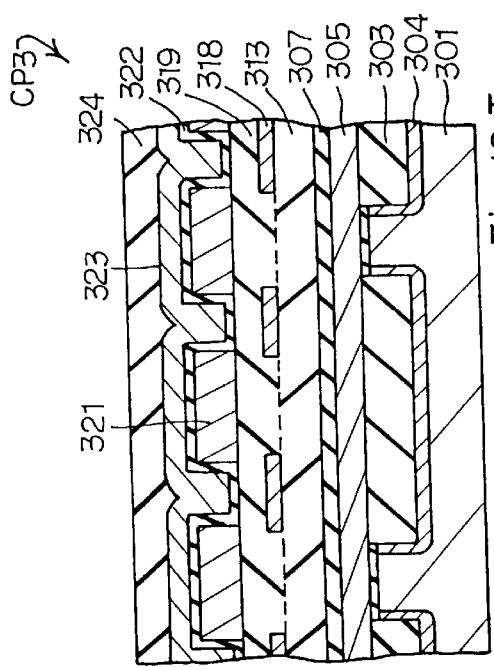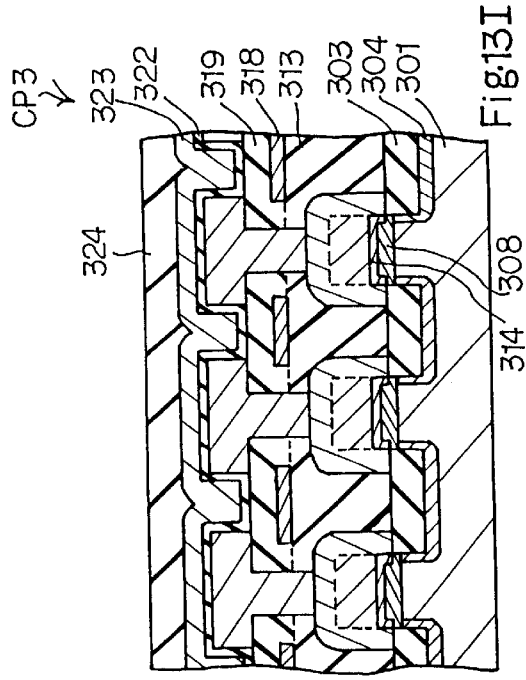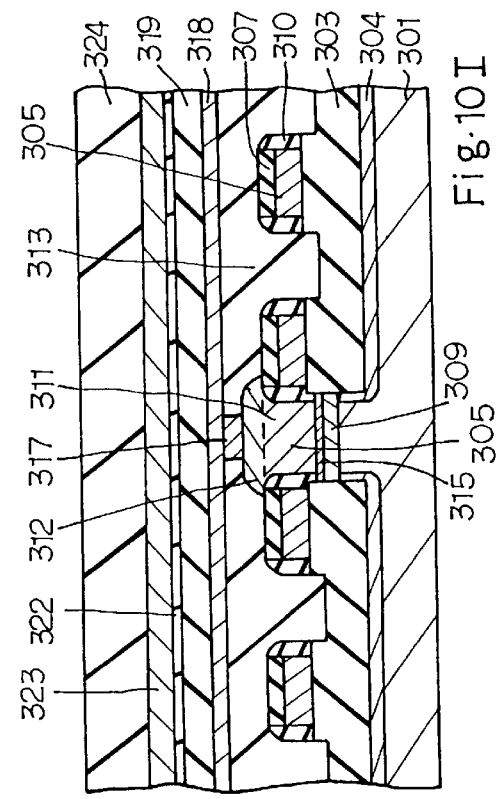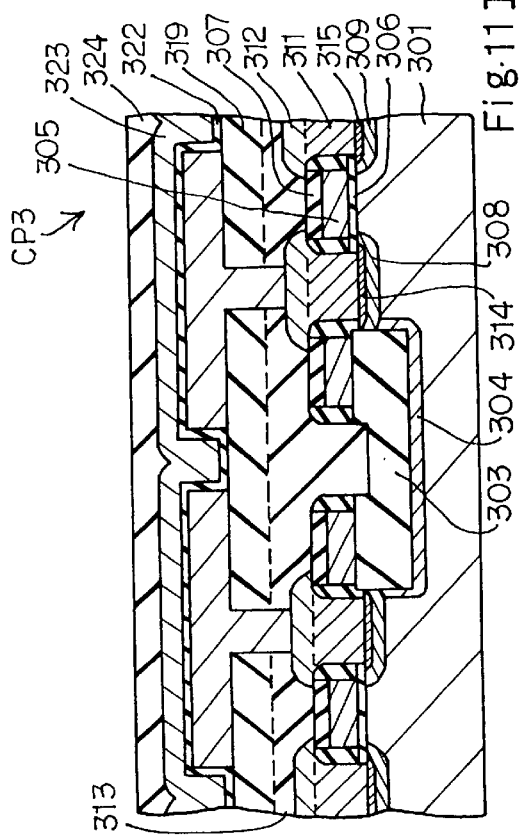

PROCESS FOR FABRICATING SEMICONDUCTOR DEVICE HAVING SEMICONDUCTOR LAYERS EPITAXIALLY GROWN FROM ACTIVE AREAS WITHOUT SHORT-CIRCUIT ON FIELD INSULATING LAYER

FIELD OF THE INVENTION

This invention relates to a process for fabricating a semiconductor device and, more particularly, to a process for fabricating a semiconductor device having semiconductor layers epitaxially grown from active areas without a short-circuit on a field insulating layer.

DESCRIPTION OF THE RELATED ART

A semiconductor dynamic random access memory device has increased the storage density at annual rate of 4/3. Accordingly, the memory cells have been miniaturized. This results in reduction in capacitance of the storage capacitor, and the small capacitance deteriorates the signal-to-noise ratio. However, the structure of the storage capacitor has been improved, and the miniaturization has been achieved without serious deterioration of signal-to-noise ratio. The storage capacitor is provided over the associated switching transistor, and is called as "stacked capacitor".

The stacked storage capacitor and the bit line require a deep and small node contact hole and a deep and small bit contact hole both passing through the inter-level insulating layer without short-circuit to the gate electrode of the switching transistor. Japanese Patent Publication of Unexamined Application No. 3-49259 proposes to grow selective epitaxial layers on the source/drain regions.

FIGS. 1 to 4 illustrate the prior art dynamic random access memory cell disclosed in the Japanese Patent Publication of Unexamined Application. Although a passivation layer is seen as the uppermost layer in FIG. 1, the passivation layer is removed so as to make the layout clear. The prior art dynamic random access memory cell is fabricated as follows.

A p-type silicon substrate 101 is firstly prepared, and the resistivity of the p-type silicon substrate 101 if 5 ohm.cm. A thick field oxide layer 102 is selectively grown in the major surface of the p-type silicon substrate 101 by using the LOCOS (local oxidation of silicon) technique, and active areas are defined in the major surface by the thick field oxide layer 102 for fabricating pairs of dynamic random access memory cells. A lightly doped p-type channel stopper 103 extends beneath the thick field oxide layer 102, and prevents the active areas from undesirable punch-through phenomenon.

Subsequently, silicon oxide is thermally grown to 10 nanometers thick on the active areas at 900 degrees in centigrade for 10 minutes, and the active areas are covered with gate oxide layers 104. Polysilicon is deposited to 300 nanometers thick over the entire surface of the resultant semiconductor structure by using a chemical vapor deposition in $SiH_2Cl_2$ at 700 degrees in centigrade, and phosphorous is diffused into the polysilicon layer at 900 degrees in centigrade for five minutes. Silicon oxide is deposited to 50 nanometers to 300 nanometers thick over the doped polysilicon layer by using a chemical vapor deposition, and the doped polysilicon layer is overlain by a silicon oxide layer. A photo-resist etching mask is formed on the silicon oxide layer by using lithographic techniques, and the silicon oxide layer and the doped polysilicon layer are patterned into gate electrodes 105 and silicon oxide strips 106 by using a reactive ion etching technique. The gate electrodes 105 form parts of word lines, and the word lines are also labeled with 105.

Using the gate electrodes 105 as an ion-implantation mask, phosphorous or arsenic is ion implanted into the active areas at dose of $1\times10^{14}$ $cm^{-2}$ under acceleration of energy of 40 KeV, and form lightly-doped source/drain regions 108 in a self-aligned manner with the gate electrodes 105.

Subsequently, silicon oxide is deposited to 50 nanometers to 150 nanometers thick over the entire surface of the resultant semiconductor structure by using the chemical vapor deposition, and the silicon oxide layer is anisotropically etched without any etching mask. Side wall spacers 107 are formed on both side surfaces of each gate electrode 105.

Silicon is selectively grown on the exposed areas of the n-type source/drain regions 108, and swells into epitaxial silicon layers 109 over the silicon oxide strips 106. The upper surfaces of the epitaxial silicon layers 109 are wider than the heavily doped n-type source regions 110. Using the gate electrodes 105 and the side wall spacers 107 as an ion-implantation mask, phosphorous or arsenic is ion implanted into the active areas at dose of $1\times10^{15}$ $cm^{-2}$ under acceleration energy of 50 KeV, and form heavily-doped n-type source/drain regions 110.

Silicon oxide is deposited to 300 nanometers thick over the entire surface of the resultant semiconductor structure, and forms a first inter-level insulating layer 111. The lightly/heavily doped source and drain regions 108/110, the gate oxide layer 104 and the gate electrode 105 form in combination an n-channel enhancement type switching transistor SW1, and the n-channel enhancement type switching transistor SW1 is covered with the first inter-level insulating layer 111.

A photo-resist etching mask (not shown) is formed on the first inter-level insulating layer 111, and the first inter-level insulating layer 111 is selectively etched away by using the reactive ion etching technique for forming storage node contact holes 112. The epitaxial silicon layers 109 over the heavily doped n-type source regions 110 are exposed to the storage node contact holes 112. As described hereinbefore, the epitaxial silicon layers 109 has the upper surfaces wider than the heavily doped n-type source regions 110, and the storage node contact holes 112 are surely nested into the upper surfaces of the epitaxial silicon layers 109. Moreover, the epitaxial silicon layers 109 prevent the gate electrodes 105 from the etchant.

Subsequently, polysilicon is deposited to 50 nanometers to 400 nanometers thick in $SiH_2Cl_2$ ambience at 700 degrees in centigrade by using the chemical vapor deposition. The polysilicon fills the storage node contact holes 112, and swells into a polysilicon layer extending on the first inter-level insulating layer 111. Phosphorous is diffused into the polysilicon layer at 900 degrees in centigrade for 50 minutes. The phosphorous-doped polysilicon layer is patterned into storage node electrodes 113 by using the lithographic techniques and the reactive ion etching.

Subsequently, silicon nitride is deposited to 10 nanometers thick over entire surface of the resultant semiconductor structure by using a chemical vapor deposition, and the storage node electrodes 113 are covered with a silicon nitride layer. A surface portion of the silicon nitride is oxidized in wet ambience at 950 degrees in centigrade for 30 minutes, and the silicon nitride layer is overlain by a silicon oxide layer. The silicon nitride layer and the silicon oxide layer form a dielectric film 114, and the storage node electrodes 113 are covered with the dielectric film 114.

Polysilicon is deposited over the entire surface of the resultant semiconductor structure, and dopant impurity is introduced into the polysilicon layer. A photo-resist etching mask (not shown) is formed on the doped polysilicon layer, and the doped polysilicon layer is patterned into a plate electrode 115. The storage node electrode 113, the dielectric film 114 and the plate electrode 115 as a whole constitute a storage capacitor CP1.

Silicon oxide and boro-phosphosilicate glass layer is reflowed at 900 degrees in centigrade for 80 minutes. The silicon oxide layer and the boro-phosphosilicate glass layer form in combination a second inter-level insulating structure 116, and the storage capacitor CP1 is covered with the second inter-level insulating structure 116.

A photo-resist etching mask (not shown) is formed on the second inter-level insulating structure 116 by using the lithographic techniques, and the second inter-level insulating structure 116, the dielectric film 114 and the first inter-level insulating layer 111 are selectively etched away by using the reactive ion etching so as to form bit contact holes 117. The epitaxial silicon layers 109 over the drain regions 110 are exposed to the bit contact holes 117, respectively. Conductive material is deposited over the entire surface of the second inter-level insulating layer 116. The conductive material is held in contact with the epitaxial silicon layers 109 exposed to the bit contact holes 117, and forms a conductive material layer. A photo-resist etching mask (not shown) is formed on the conductive material layer by using the lithographic techniques, and the conductive material layer is patterned into bit lines 118 by using the reactive ion etching or an isotropic etching such as CDE process. The bit lines 118 are formed of polysilicon, polyside or aluminum.

Finally, silicon oxide is deposited over the entire surface of the resultant semiconductor structure, and forms a third inter-level insulating layer 119.

The epitaxial silicon layers 109 provide the contact areas wider than the heavily-doped n-type source/drain regions 110, and increase the nesting tolerance between the contact areas and the node contact holes/bit contact holes 112/117. The silicon layers 109 are epitaxially grown from the heavily doped n-type source/drain regions 110 in not only the upward direction but also the lateral direction. However, the side wall spacers 107 do not allow the silicon layers 109 to be grown in the lateral direction. For this reason, the silicon layers 109 are upwardly grown until the upper surfaces exceed the silicon oxide strips 106, and, thereafter, are grown in both upward and lateral directions (see FIG. 2). The side wall spacers 107 are formed on the side surfaces of the gate electrodes 105 only. In other words, the silicon layers are freely grown over the thick field oxide layer 102 as shown in FIG. 4. If the silicon layers 109 extend over the thick field oxide layer 102 by a half of the width of the thick field oxide layer 102, the silicon layers 109 are merged with one another, and short-circuit takes place. This means that the width of the thick field oxide layer 102 sets a limit on the epitaxial growth of the silicon layers 109. In this situation, when the memory cells are scaled down, the thick field oxide layer 102 is decreased in width, and the silicon layers 109 hardly exceed the silicon oxide strips 106. In other words, the epitaxial growth is stopped in the gap between the side wall spacers 107, and the silicon layers 109 do not provide the wide contact areas for the storage node electrodes 115 and the bit lines 119. Recently, the thick field oxide layer 102 is buried in the silicon substrate 101 so as to improve the step coverage, and the buried field oxide layer allows the silicon layers 109 to be rapidly merged with one another.

Although the Japanese Patent Publication of Unexamined Application teaches that the silicon layers 109 are prevented from the short-circuit through a selective etching using a stripe mask pattern in the A—A direction. However, when the memory cells are scaled down, the thick field oxide layer 102 becomes narrow, and it is difficult to form the stripe mask exactly over the thick field oxide layer 102. If the stripe mask pattern exposes the silicon layers 109 over the heavily-doped n-type source/drain regions 110 to the etchant, the silicon layer 109 is split into two layers, and the insulating material penetrates into the gap during the formation of the first inter-level insulating layer 111.

Moreover, the selective epitaxial growth for the silicon layers 109 is a self-aligned process without a mask pattern, and is desirable. If the selective etching is required for the disconnection between the silicon layers, the advantage of selective growth is spoilt, and the fabrication process is complicated.

SUMMARY OF THE INVENTION

It is therefore an important object of the present invention to provide a process for fabricating a semiconductor device without a short-circuit between silicon layers epitaxially grown from active areas.

To accomplish the object, the present invention proposes to change epitaxial growing conditions for anisotropical growth to epitaxial growing conditions for isotropical growth.

In accordance with one aspect of the present invention, there is provided a process for fabricating a semiconductor device comprising the steps of: a) forming a plurality of semiconductor areas spaced from each other by an insulating region, formed by a first crystal plane allowing first semiconductor layers to be grown faster than a second crystal plane perpendicular to the first crystal plane and higher than the insulating region so as to expose side surfaces of the second crystal plane; b) forming a plurality of insulating walls on the insulating region so that the semiconductor areas are exposed to a gap therebetween; c) anisotropically growing first semiconductor layers from the plurality of semiconductor areas in such a manner as to have a first growing speed in a direction perpendicular to the plurality of semiconductor areas larger than a second growing speed in a direction parallel to the plurality of semiconductor areas; d) isotropically growing second semiconductor layers from the first semiconductor layers in such a manner as to equalize the first growing speed to the second growing speed for extending the second semiconductor layers on upper surfaces of the plurality of insulating walls; and e) completing the semiconductor device.

BRIEF DESCRIPTION OF THE DRAWINGS

The features and advantages of the process will be more clearly understood from the following description taken in conjunction with the accompanying drawings in which:

FIGS. 5A to 5I are plan views showing a process for fabricating a semiconductor dynamic random access memory device according to the present invention;

FIGS. 6A to 6I are cross sectional views taken along lines A—A' of FIGS. 5A to 5I and showing the structure of the semiconductor dynamic random access memory device;

FIGS. 7A to 7I are cross sectional views taken along lines B—B' of FIGS. 5A to 5I and showing the structure of the semiconductor dynamic random access memory device from a different angle;

FIGS. 8A to 8I are cross sectional views taken along lines C—C' of FIGS. 5A to 5I and showing the structure of the semiconductor dynamic random access memory device from a different angle;

FIGS. 9A to 9I are plan views showing another process for fabricating a semiconductor dynamic random access memory device according to the present invention;

FIGS. 10A to 10I are cross sectional views taken along lines A—A' of FIGS. 9A to 9I and showing the structure of the semiconductor dynamic random access memory device;

FIGS. 11A to 11I are cross sectional views taken along lines B—B' of FIGS. 9A to 9I and showing the structure of the semiconductor dynamic random access memory device from a different angle;

FIGS. 12A to 12I are cross sectional views taken along lines C—C' of FIGS. 9A to 9I and showing the structure of the semiconductor dynamic random access memory device from a different angle; and FIGS. 13A to 13I are cross sectional views taken along lines D—D' of FIGS. 9A to 9I and showing the structure of the semiconductor dynamic random access memory device from a different angle.

DESCRIPTION OF THE PREFERRED EMBODIMENTS

First Embodiment

Figure 1:
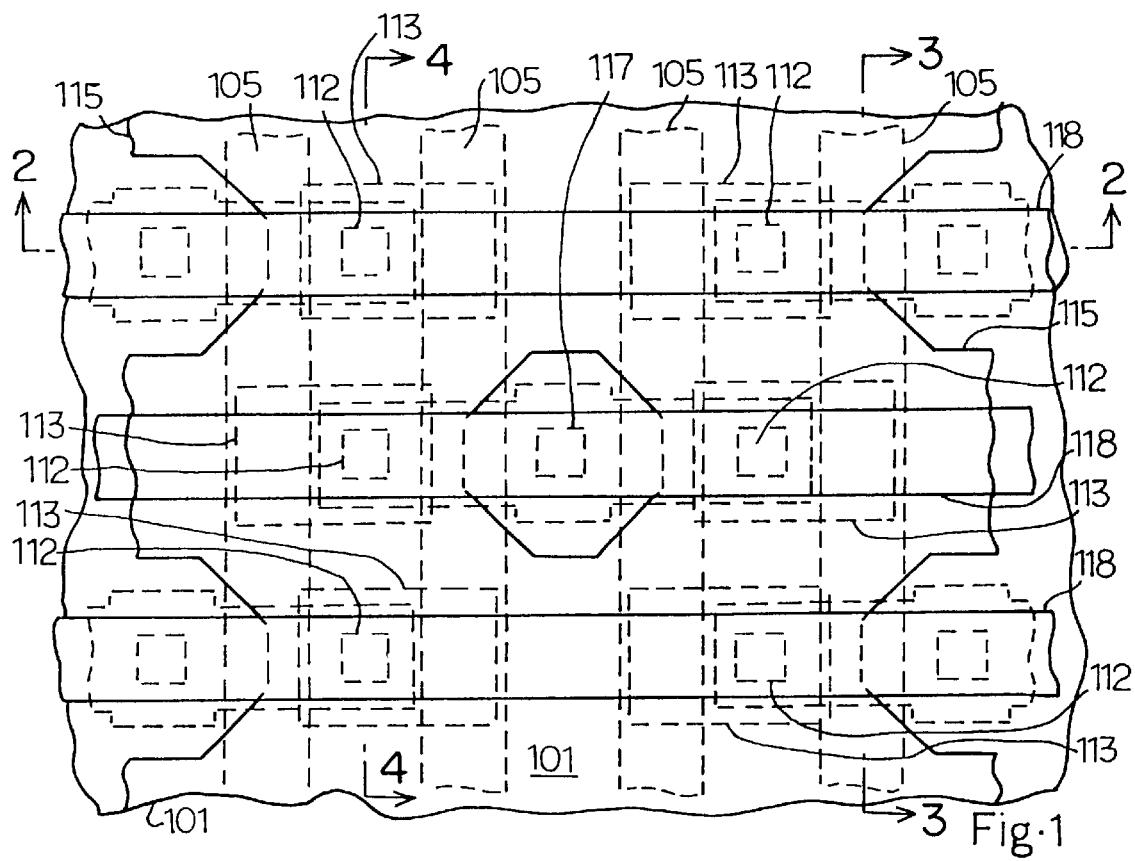
FIG. 1 is a plan view showing the layout of the prior art dynamic random access memory cells.
Figure 2:
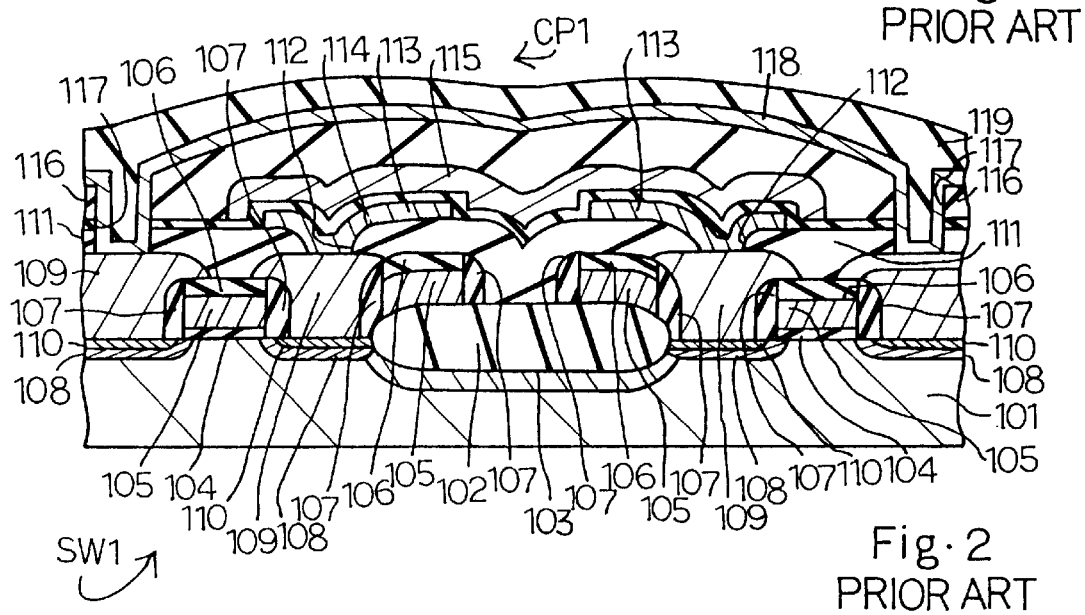
FIG. 2 is a cross sectional view taken along line A—A of FIG. 1 and showing the structure of the prior art dynamic random access memory cell.
Figure 3:
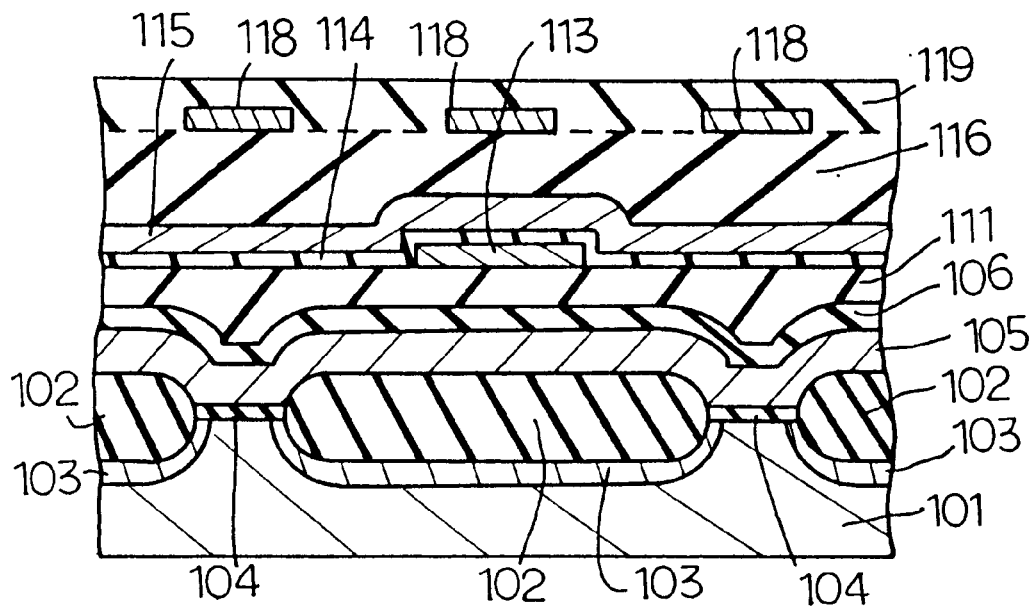
FIG. 3 is a cross sectional view taken along line B—B of FIG. 1 and showing the structure of the prior art dynamic random access memory cell from another angle.
Figure 4:
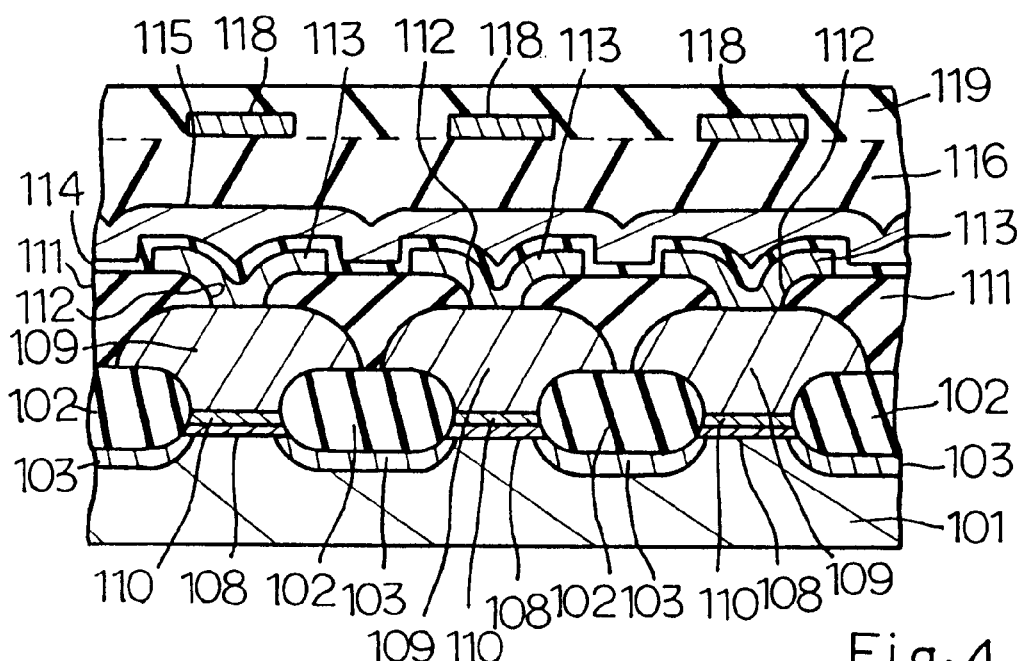
FIG. 4 is a cross sectional view taken along line C—C of FIG. 1 and showing the structure of the prior art dynamic random access memory cell from another angle.
Figure 5G:
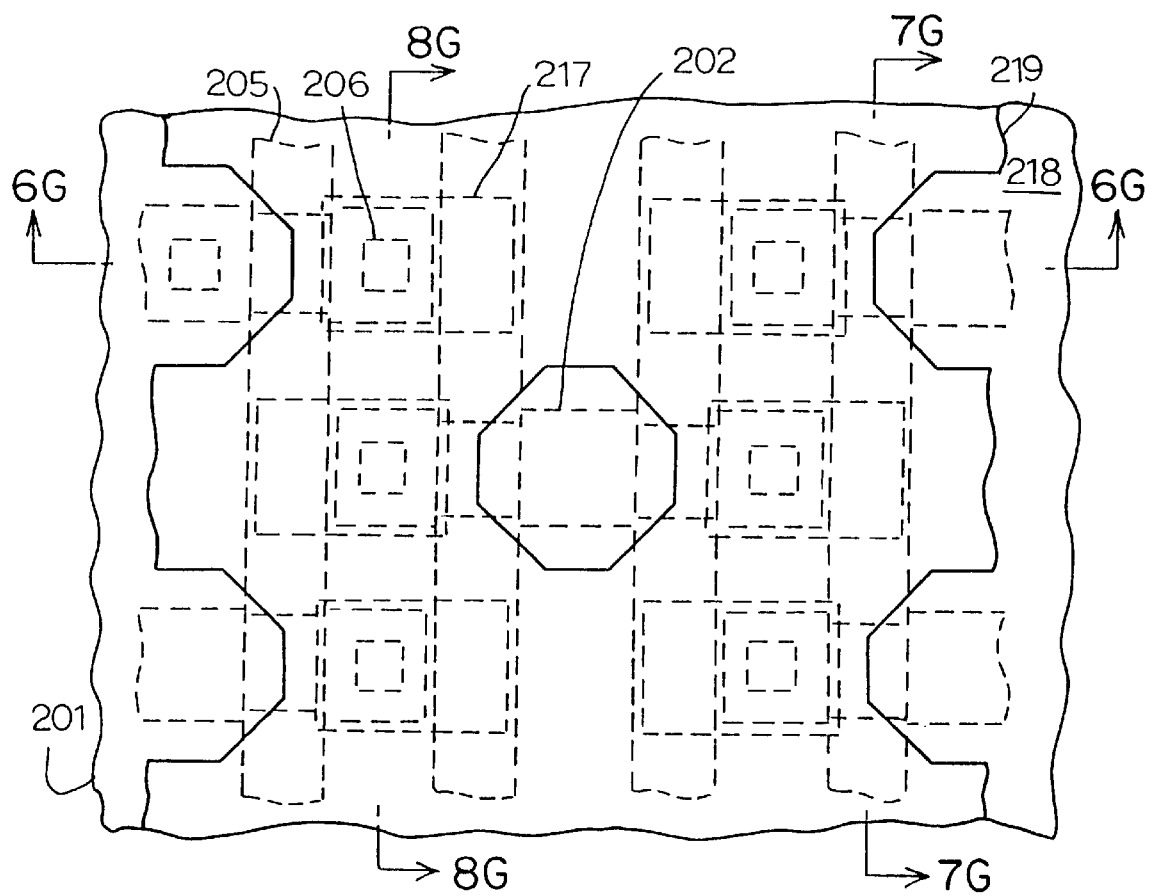
Figure 6G:
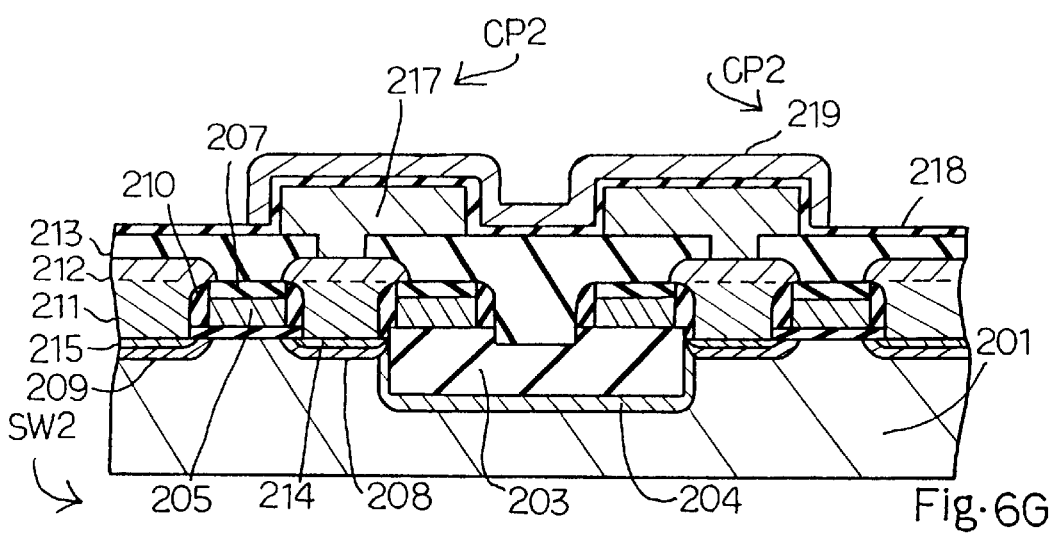
Figure 5H:
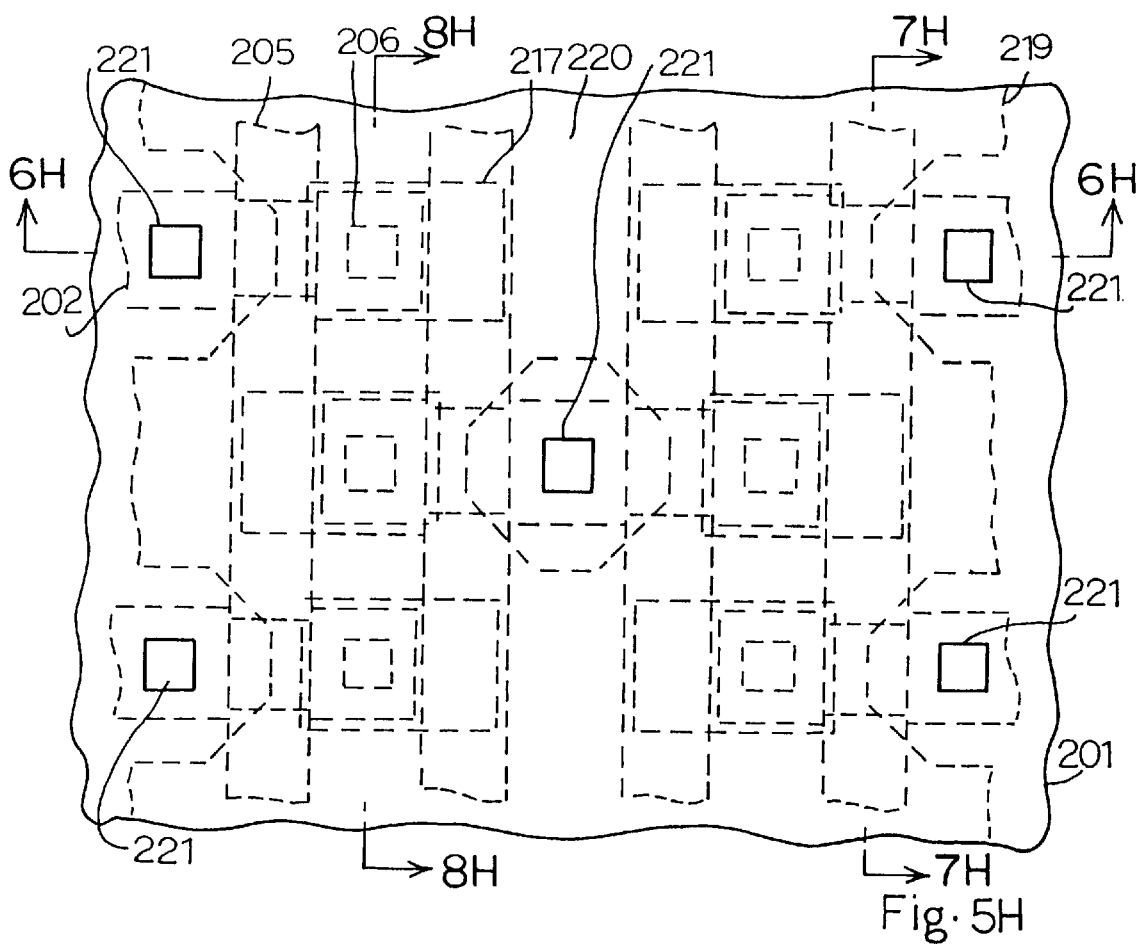
Figure 6H:
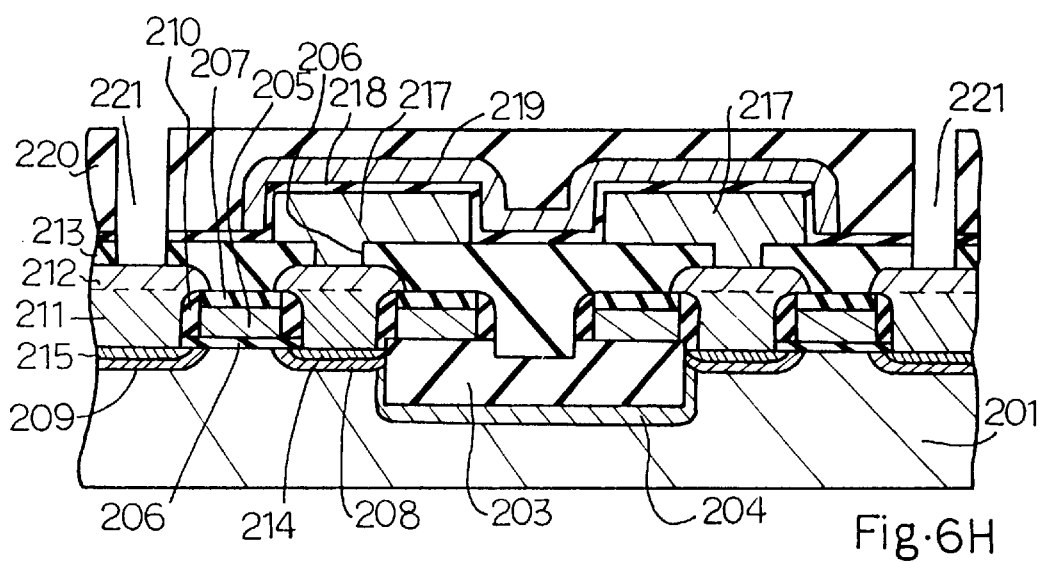
Figure 5I:
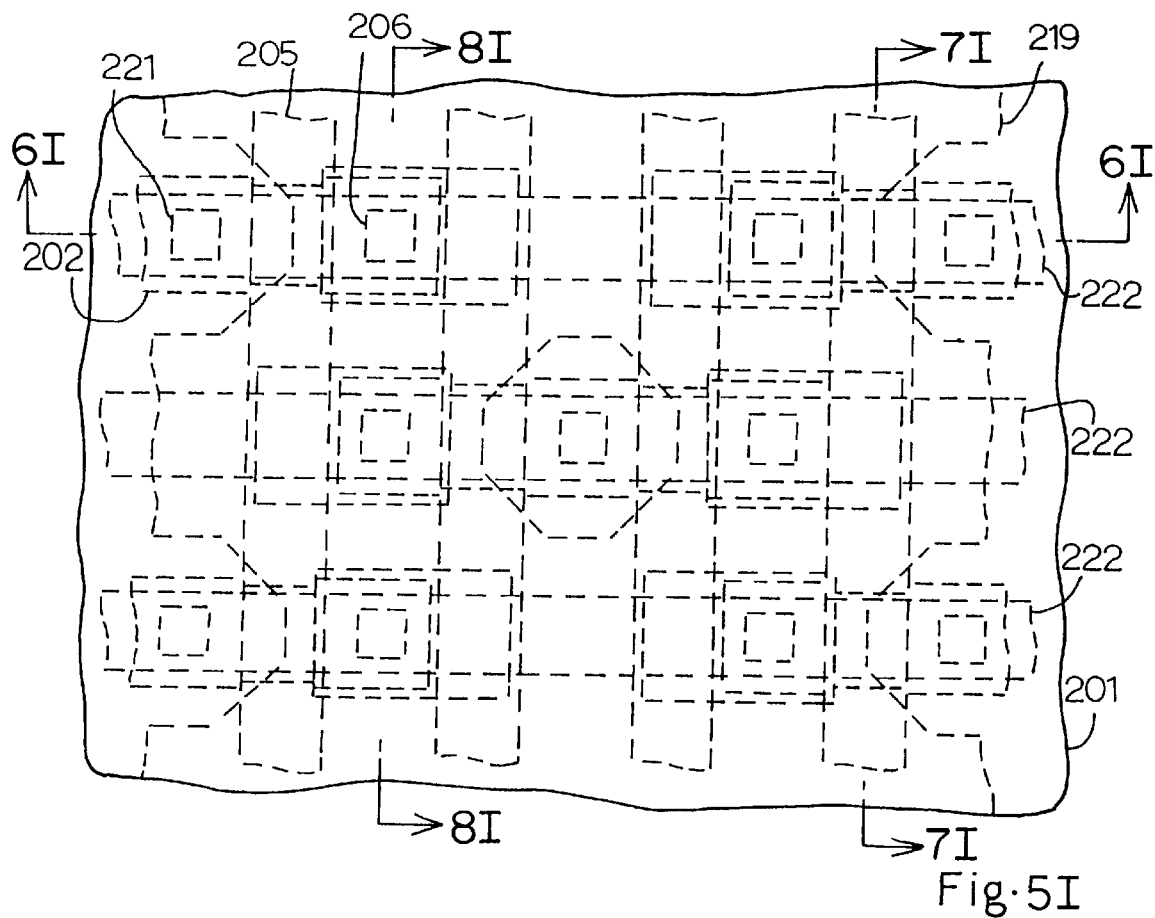
Figure 6I:
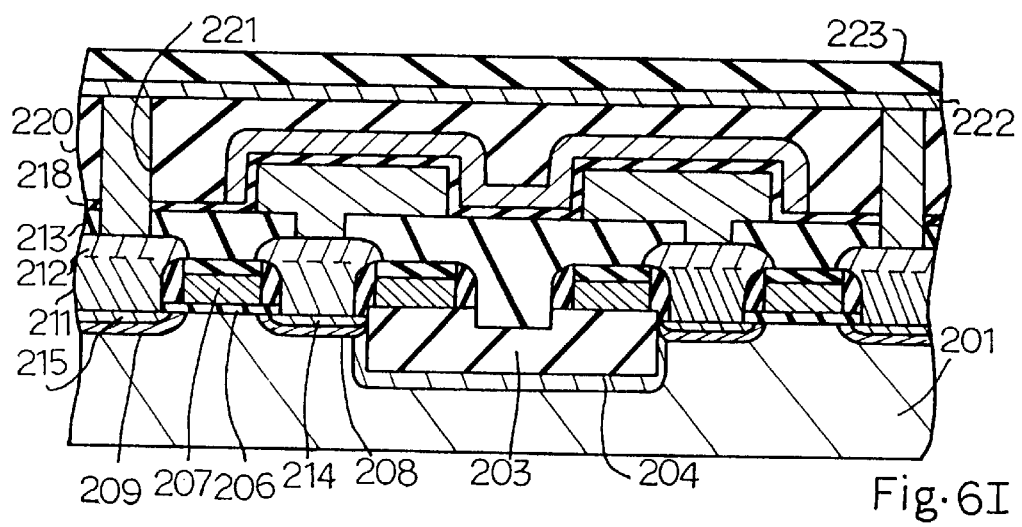
Figure 7G:
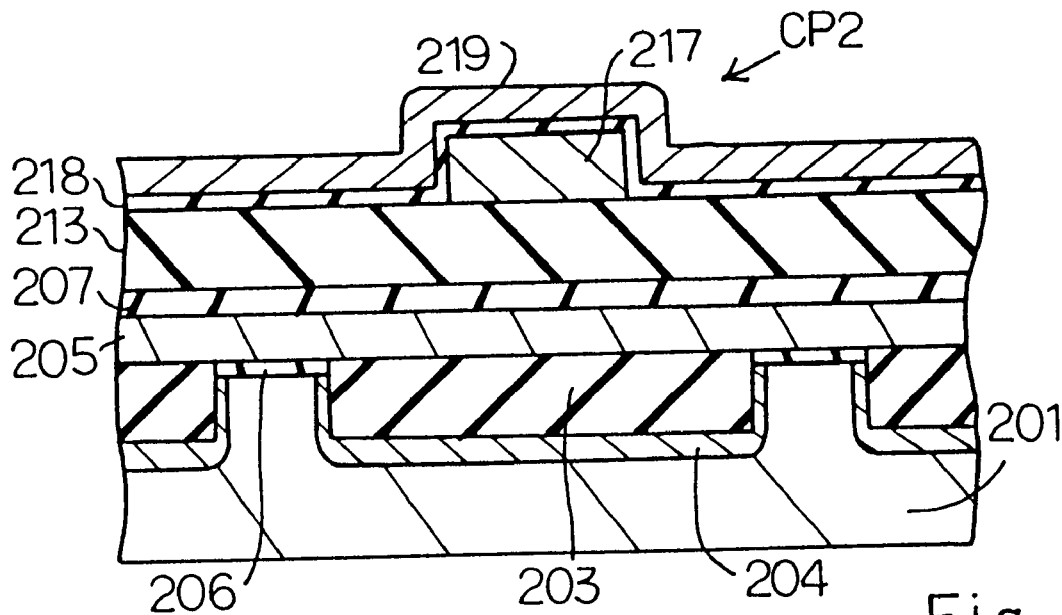
Figure 8G:
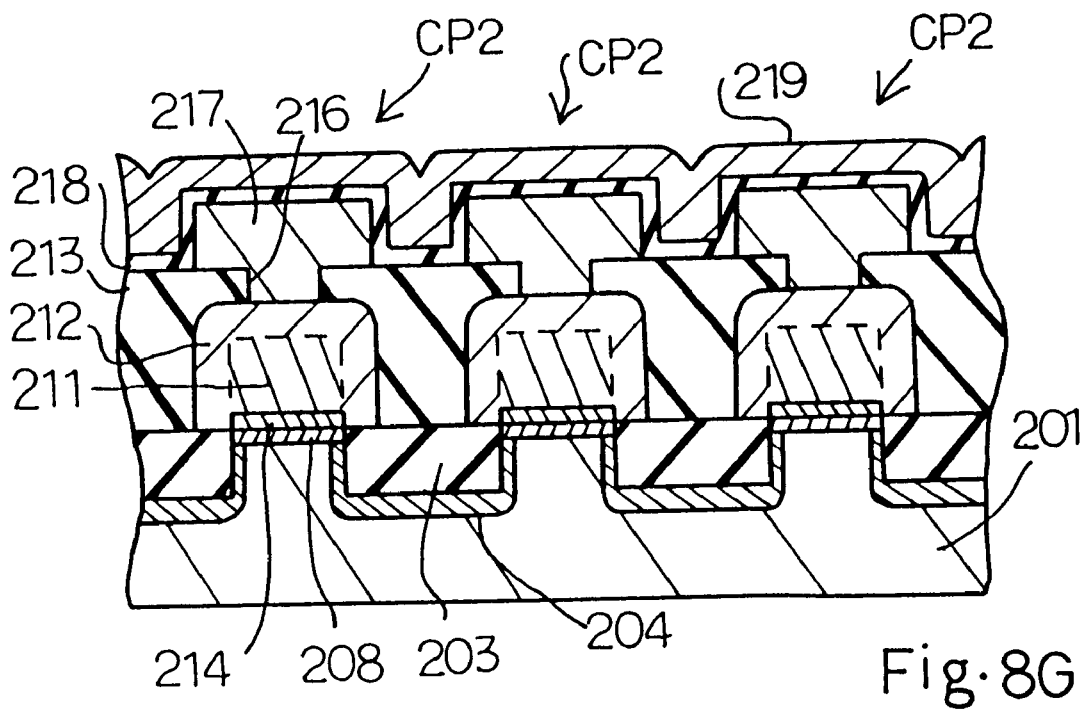
Figure 7H:
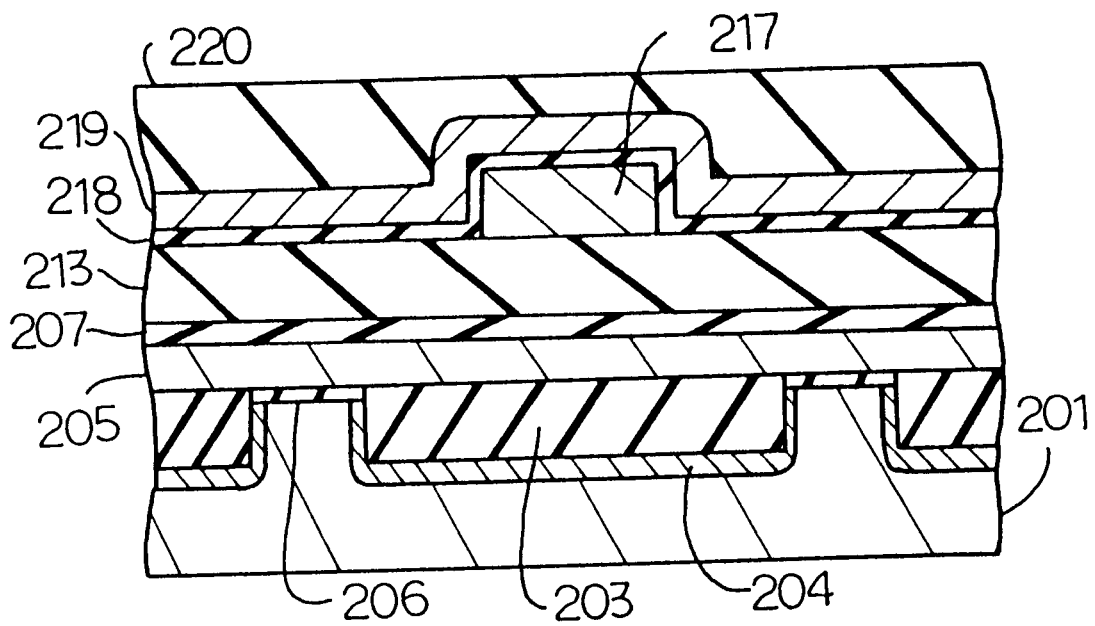
Figure 8H:
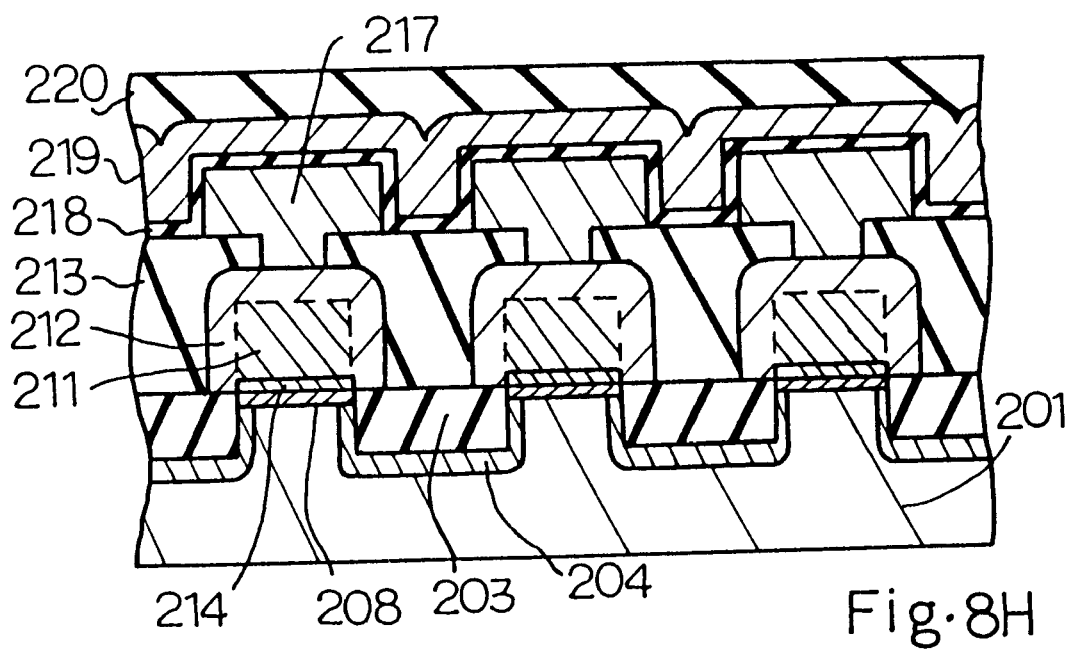
Figure 7I:
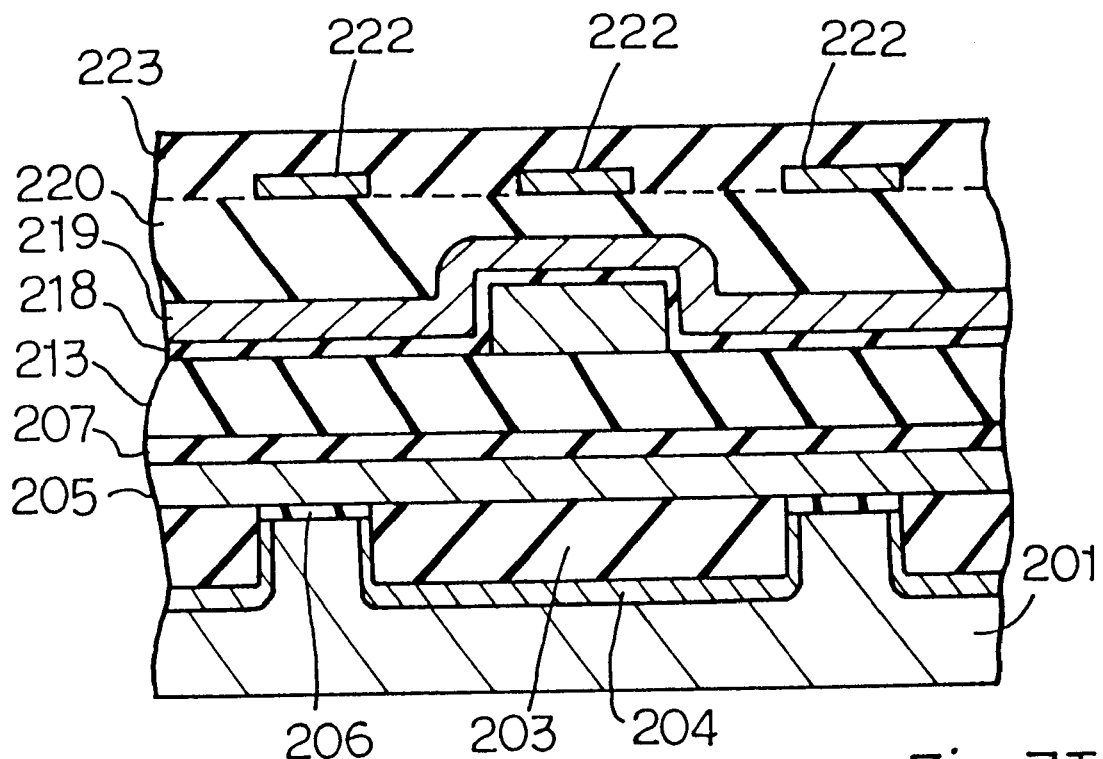
Figure 8I:
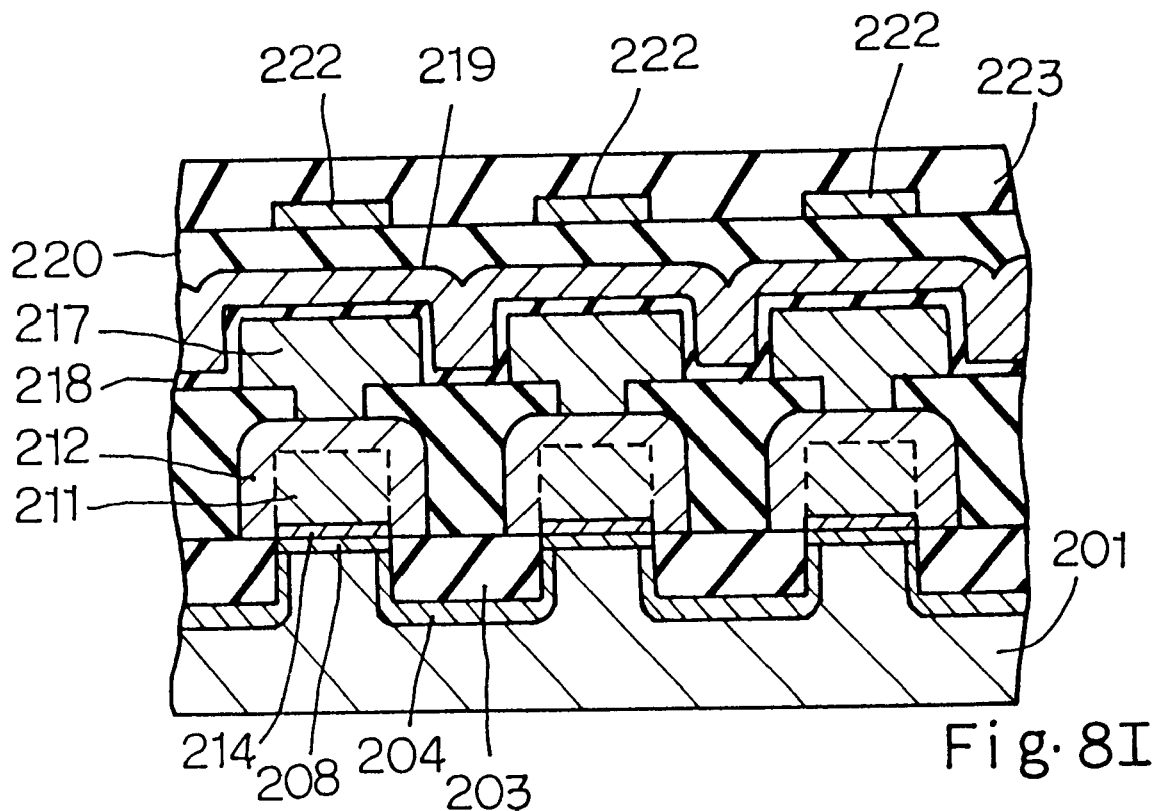

FIGS. 5A to 5I, 6A to 6I, 7A to 7I and 8A to 8I illustrates a process for fabricating a semiconductor dynamic random access memory device embodying the present invention, and the semiconductor dynamic random access memory device is designed under 0.25 micron design rules. The figures labeled with the same alphabet letter such as "A", "B", . . . illustrate a certain step in the fabrication process. For examples, FIGS. 5A, 6A, 7A and 8A illustrate the step of defining active areas in a major surface. In those figures, when a layer or a region is firstly referred to, all the layer or all the region are labeled with a certain reference sign in a set of figures. However, only one layer/region or two layers/regions are labeled with the certain reference in the figures illustrating the later steps for the sake of simplicity.

The process starts with preparation of a p-type silicon substrate 201. The p-type silicon substrate 201 has the resistivity of 10 ohm.cm, and crystal plane (100) forms a major surface of the p-type silicon substrate 201. N-type wells and p-type wells are selectively formed in the p-type silicon substrate 201; however, the n-type wells and the p-type wells are not shown in the figures.

Photo-resist is spun onto the major surface of the p-type silicon substrate 201, and is baked so as to form a photo-resist layer. A pattern image is transferred from a reticle (not shown) to the photo-resist layer, and forms a latent image in the photo-resist layer. The latent image is developed, and the photo-resist layer is formed into a photo-resist etching mask (not shown). Thus, the photo-resist etching mask is formed on the major surface of the p-type silicon substrate 201 by using the lithographic techniques, and the photo-resist mask covers predetermined areas assigned to active areas, respectively.

Using the photo-resist etching mask, the p-type silicon substrate 201 is selectively etched away, and a trench of 350 nanometers deep is formed in the surface portion of the silicon substrate 201. Boron is obliquely implanted into the p-type silicon substrate 201 around the trench as dose of $5 \times 10^{12}$ cm$^{-2}$ under acceleration energy of 20 KeV. The p-type silicon substrate 201 is rotated during the ion-implantation, and the boron is doped into a surface portion of the p-type silicon substrate 201 defining the trench. The trench defines active areas 202 where pairs of memory cells are respectively assigned. The active areas 202 have a rectangular planar configuration, and are oriented in such a manner that all the four edges 202a (see FIG. 5A) are in parallel to crystal direction <110> of the p-type silicon substrate 201.

Silicon oxide is deposited over the entire surface of the resultant semiconductor structure by using a chemical vapor deposition. The silicon oxide fills the trench, and swells into a silicon oxide layer. The silicon oxide layer is chemically mechanically polished so as to expose the active areas 202, again. Then, a buried insulating region 203 is left in the trench. As described hereinbefore, the semiconductor dynamic random access memory device is designed under 0.25 micron, and a thick filed oxide grown through the LOCOS insufficiently isolates the active areas 202. For this reason, the buried insulating region 203 is employed in the fabrication process according to the present invention.

The resultant semiconductor structure is heated to 850 degrees in centigrade for 30 minutes so as to activate the implanted boron, and lightly-doped p-type punch-through stopper layers 204 are formed beneath the buried insulating region 203. The buried insulating region 203 defines the active areas 202, and the buried insulating region 203 and the active areas 202 are substantially coplanar with each other. FIGS. 5A, 6A, 7A and 8A illustrate the layout on the major surface of the p-type silicon substrate 201 and the resultant semiconductor structure.

Subsequently, silicon oxide is thermally grown to 8.5 nanometers thick on the active areas 202 at 850 degrees in centigrade, and silicon oxide layers are formed on the active areas 202. Phosphorous-doped polysilicon is deposited to 50 nanometers thick over the entire surface of the resultant semiconductor structure at 700 degrees in centigrade by using a chemical vapor deposition, and, thereafter, tungsten silicide is deposited to 100 nanometers thick over the phosphorous-doped polysilicon layer by using a sputtering. Silicon oxide is further deposited to 150 nanometers thick over the tungsten silicide layer by using the chemical vapor deposition, and forms a silicon oxide layer. Thus, the silicon oxide layer and the tungsten silicide layer are laminated on the phosphorous-doped polysilicon layer.

A photo-resist etching mask (not shown) is formed on the uppermost silicon oxide layer by using the lithographic techniques, and covers predetermined areas of the upper most silicon oxide layer over word lines 205. Using the photo-resist etching mask, the silicon oxide layer, the tungsten silicide layer, the phosphorous-doped polysilicon layer and the silicon oxide layers are selectively etched away by using a reactive ion etching technique, and gate insulating layers 206, the word lines 205 and silicon oxide strips 207 are patterned on channel regions. Parts of the word lines 205 on the gate insulating layers 206 serve as gate electrodes, respectively, and the gate electrodes are also labeled with reference numeral 205 in the following description.

Using the gate electrodes 205 as an ion-implantation mask, phosphorous or arsenic is ion implanted into the active areas 202 at dose of $2\times10^{13}$ cm$^{-2}$ under acceleration energy of 30 KeV, and forms lightly doped n-type source region 208 and lightly doped n-type drain regions 209 in the active areas 202.

Silicon oxide is deposited to 50 nanometers thick over the entire surface of the resultant semiconductor structure by using the chemical vapor deposition, and a silicon oxide layer conformably extends over the resultant semiconductor structure. The silicon oxide layer is etched back by using the reactive ion etching without an etching mask, and side wall spacers 210 remain on the side surfaces of the word lines 205 as shown in FIGS. 5B, 6B, 7B and 8B. The silicon oxide strips 207 are partially etched away, and are decreased to 100 nanometers thick. Accordingly, the buried isolating region 202 is also etched, and the exposed surface of the buried isolating region 203 is lower than the lightly-doped n-type source/drain regions 208/209 by 50 nanometers. Crystal plane of (110) forms the side surfaces 208a of the lightly-doped n-type source/drain regions 208/209 (see FIG. 8B).

Subsequently, the resultant semiconductor structure is placed in a reaction chamber, and first silicon pads 211 are epitaxially grown to 250 nanometers high on the lightly doped n-type source/drain regions 208/209, respectively. The upper surfaces of the first silicon pads 211 are as high as the silicon oxide strips 207 as shown in FIGS. 5C, 6C, 7C and 8C. The epitaxial growth is carried out under the following conditions. The substrate temperature is 700 degrees in centigrade, and the reaction chamber is regulated to $1\times10^{-2}$ Pa. Gaseous mixture is supplied to the reaction chamber, and Si$_2$H$_6$ is regulated to 1 sccm. PH$_3$ is further mixed into the gaseous mixture. PH$_3$ is diluted in H$_2$ as 1%, and is regulated to 0.1 sccm.

The silicon grown on the crystal plane (100) is more than hundred times faster than the silicon grown in the crystal plane (110). For this reason, the first silicon pads 211 are upwardly grown on the lightly-doped n-type source/drain regions 208/209. However, the epitaxial growth in the lateral direction is a little. The first silicon pads 211 are doped with phosphorous at $1\times10^{19}$ cm$^{-3}$. The epitaxial growing conditions are variable depending upon the epitaxial growing system. For this reason, the epitaxial growing conditions are never limited to the above, and are appropriately modified in so far as the silicon pads 211 are anisotropically grown.

Subsequently, second silicon pads 212 are epitaxially grown to 100 nanometers thick on the first silicon pads 211, respectively, under the following conditions. The substrate temperature is 700 degrees in centigrade, and the reaction chamber is regulated to $1\times10^{-2}$ Pa. Gaseous mixture is supplied to the reaction chamber, and Si$_2$H$_6$ is regulated to 10 sccm. PH$_3$ is further mixed into the gaseous mixture. PH$_3$ is diluted in H$_2$ at 1%, and is regulated to 0.1 sccm. The epitaxial growth under the above conditions cause the second silicon pads 212 to be grown on the crystal planes (100) and (110) at certain speed approximately equal therebetween. For this reason, the second silicon pads 212 are isotropically grown from the first silicon pads 211, and the second silicon pads 212 provide contact areas wider than the lightly doped n-type source/drain regions 208/209 as shown in FIGS. 5D, 6D, 7D and 8D. The second silicon pads 212 are doped with the phosphorous at $1\times10^{19}$ cm$^{-3}$. The epitaxial growing conditions are also variable in so far as the epitaxial growth is isotropic.

The word line 205 is 0.25 micron wide or 250 nanometers wide, and two side wall spacers 210 add 100 nanometers to the width of the word line 205. Therefore, the first silicon pad 211 is spaced from the adjacent first silicon pads 211 by 250 nanometers. The second silicon pad 212 laterally projects from the first silicon pad 211 by 100 nanometers, and is spaced from the adjacent second silicon pad 212 by 150 nanometers. Thus, the second silicon pads 212 are never merged with one another over the word lines 205.

The buried isolating region 203 is 300 nanometers wide, and the first silicon pad 211 is also spaced from the adjacent first silicon pad 211 by 300 nanometers. The second silicon pad 212 laterally projects from the first silicon pad 211 by 100 nanometers, and is spaced from the adjacent second silicon pad 212 by 100 nanometers. Thus, the second silicon pads 212 are never merged with each other on the buried isolating region 203.

In comparison, if a silicon pad is epitaxially grown to 350 nanometers high on the lightly-doped n-type source/drain regions 208/209 under the conditions for the second silicon pad 212 as similar to the prior art, the silicon pads are spaced on the word line 205 by 150 nanometers. However, the silicon pads are merged with one another on the buried isolating region 203.

Silicon oxide and boro-phosphosilicate glass are successively deposited to 100 nanometers thick and 300 nanometers thick over the entire surface of the resultant semiconductor structure, and the boro-phosphosilicate glass layer is reflowed at 800 degrees in centigrade for 10 minutes. The boro-phosphosilicate glass layer is etched back by 200 nanometers thick, and the remaining boro-phosphosilicate glass layer forms a first inter-level insulating layer 213. While the boro-phosphosilicate glass layer is reflowed, the phosphorous is diffused into the lightly doped n-type source/drain regions 208/209, and heavily doped n-type source/drain regions 214/215 are formed in the lightly-doped n-type source/drain regions 208/209, respectively. The lightly/heavily doped source/drain regions 208/209/214/215, the gate insulating layer 206 and the gate electrode 205 form in combination an n-channel enhancement type switching transistor SW2, and the n-channel enhancement type switching transistor SW1 is covered with the first inter-level insulating layer 213.

A photo-resist etching mask (not shown) is formed on the first inter-level insulating layer 213 by using the lithographic techniques, and the first inter-level insulating layer 213 is selectively etched away for forming storage node contact holes 216 as shown in FIGS. 5E, 6E, 7E and 8E.

The second silicon pads 212 over the heavily doped n-type source regions 214 are exposed to the storage node contact holes 216. As described hereinbefore, the second silicon pads 212 have the upper surfaces wider than the heavily doped n-type source regions 214. The second silicon pad 212 projects on the silicon oxide strips 207 by 50 nanometers and on the buried isolating region 203 by 100 nanometers. The nesting tolerance on the silicon oxide strips 207 is increased by 50 nanometers, and the nesting tolerance on the buried isolating region 203 is increased by 100 nanometers. For this reason, the storage node contact holes 216 are surely nested into the upper surfaces of the second silicon pads 212.

Subsequently, phosphorous-doped polysilicon is deposited to 800 nanometers thick at 700 degrees in centigrade by using the chemical vapor deposition. The phosphorous-doped polysilicon fills the storage node contact holes 216, and swells into a phosphorous-doped polysilicon layer extending on the first inter-level insulating layer 213. A photo-resist etching mask is formed on the phosphorous-doped polysilicon layer by using the lithographic techniques, and the phosphorous-doped polysilicon layer is patterned into storage node electrodes 217 by using the reactive ion etching as shown in FIGS. 5F, 6F, 7F and 8F.

Subsequently, tantalum oxide is deposited over the entire surface of the resultant semiconductor structure by using a chemical vapor deposition, and the tantalum oxide layer is equivalent to a silicon oxide layer of 2.5 nanometers thick. The storage node electrodes 217 are covered with the tantalum oxide layer. The tantalum oxide layer is oxidized in at 800 degrees in centigrade for 1 minute, and forms a dielectric film 218.

Titanium nitride is deposited over the entire surface of the resultant semi-conductor structure by using a sputtering technique, and a photo-resist etching mask (not shown) is formed on the titanium nitride layer. The titanium nitride layer is patterned into a plate electrode 219 by using a reactive ion etching as shown in FIGS. 5G, 6G, 7G and 8G. The storage node electrode 217, the dielectric film 218 and the plate electrode 219 as a whole constitute a storage capacitor CP2.

Silicon oxide and boro-phosphosilicate glass are deposited to 300 nanometers thick over the entire surface of the resultant semiconductor structure, and the boro-phosphosilicate glass layer is reflowed at 800 degrees in centigrade for 10 minutes. The silicon oxide layer and the boro-phosphosilicate glass layer form in combination a second inter-level insulating structure 220, and the storage capacitor CP1 is covered with the second inter-level insulating structure 220.

A photo-resist etching mask (not shown) is formed on the second inter-level insulating structure 220 by using the lithographic techniques, and the second inter-level insulating structure 220, the dielectric film 218 and the first inter-level insulating layer 213 are selectively etched away by using the reactive ion etching so as to form bit contact holes 221 as shown in FIGS. 5H, 6H, 7H and 8H.

The second silicon pads 212 over the heavily-doped n-type drain regions 214 are exposed to the bit contact holes 221, respectively. Conductive material is deposited over the entire surface of the second inter-level insulating layer 220. The conductive material is held in contact with the second silicon pads 212 exposed to the bit contact holes 221, and forms a conductive material layer. A photo-resist etching mask (not shown) is formed on the conductive material layer by using the lithographic techniques, and the conductive material layer is patterned into bit lines 222 by using the reactive ion etching. The bit lines 222 are formed of polysilicon, polyside or aluminum.

Finally, silicon oxide is deposited over the entire surface of the resultant semiconductor structure, and forms a third inter-level insulating layer 223. The resultant semiconductor structure is illustrated in FIGS. 5I, 6I, 7I and 8I.

As will be appreciated from the foregoing description, the first silicon pads 211 are grown over the heavily doped n-type source/drain regions 214/215 without substantial lateral growth, and the second silicon pads 211 are isotropically grown from the first silicon pads 211 so as to increase the contact areas. As a result, the nesting tolerance between the node/bit contact hole and the second silicon pad is increased without short-circuit between the adjacent second silicon pads.

Second Embodiment

Figure 9E:
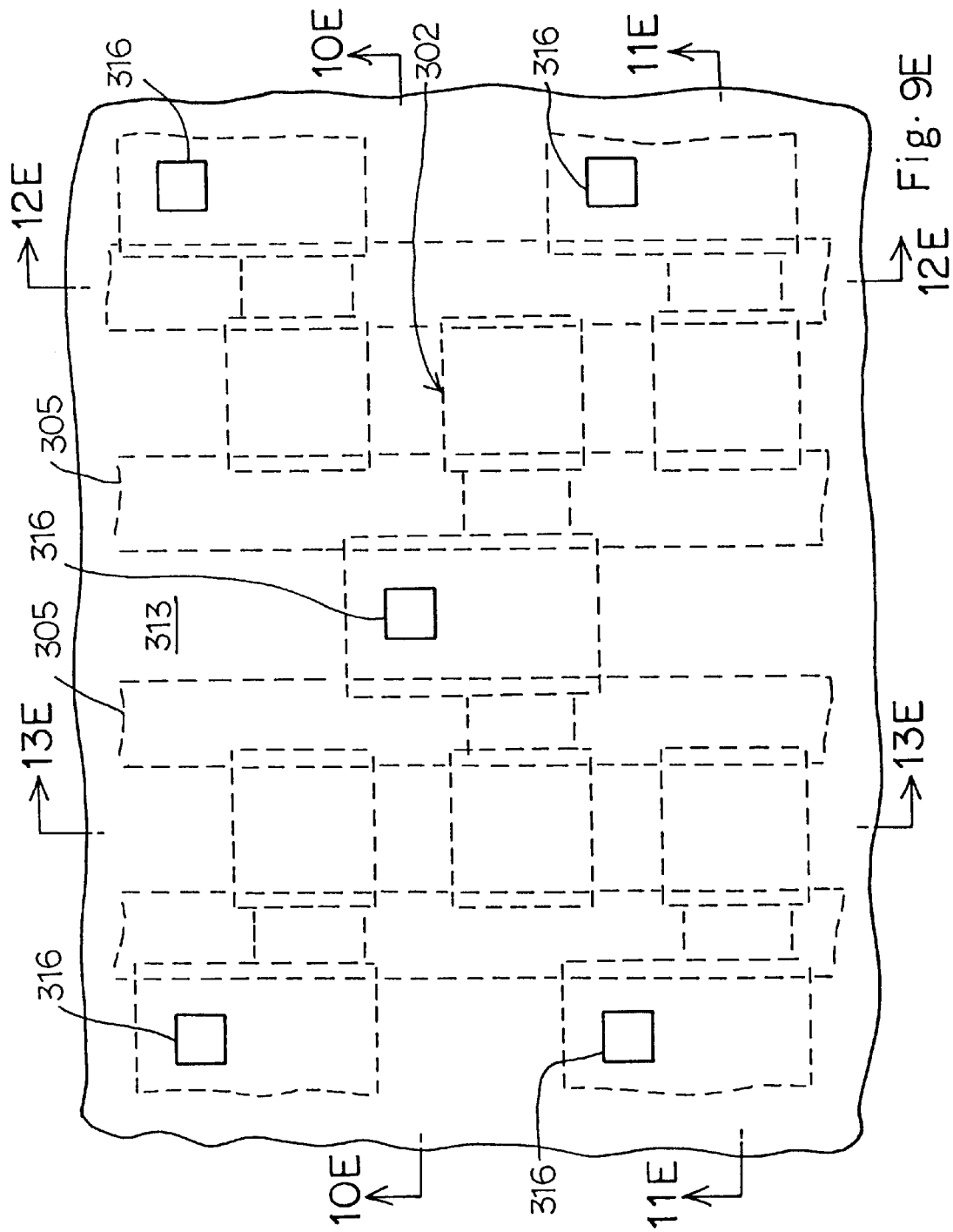
Figure 9F:
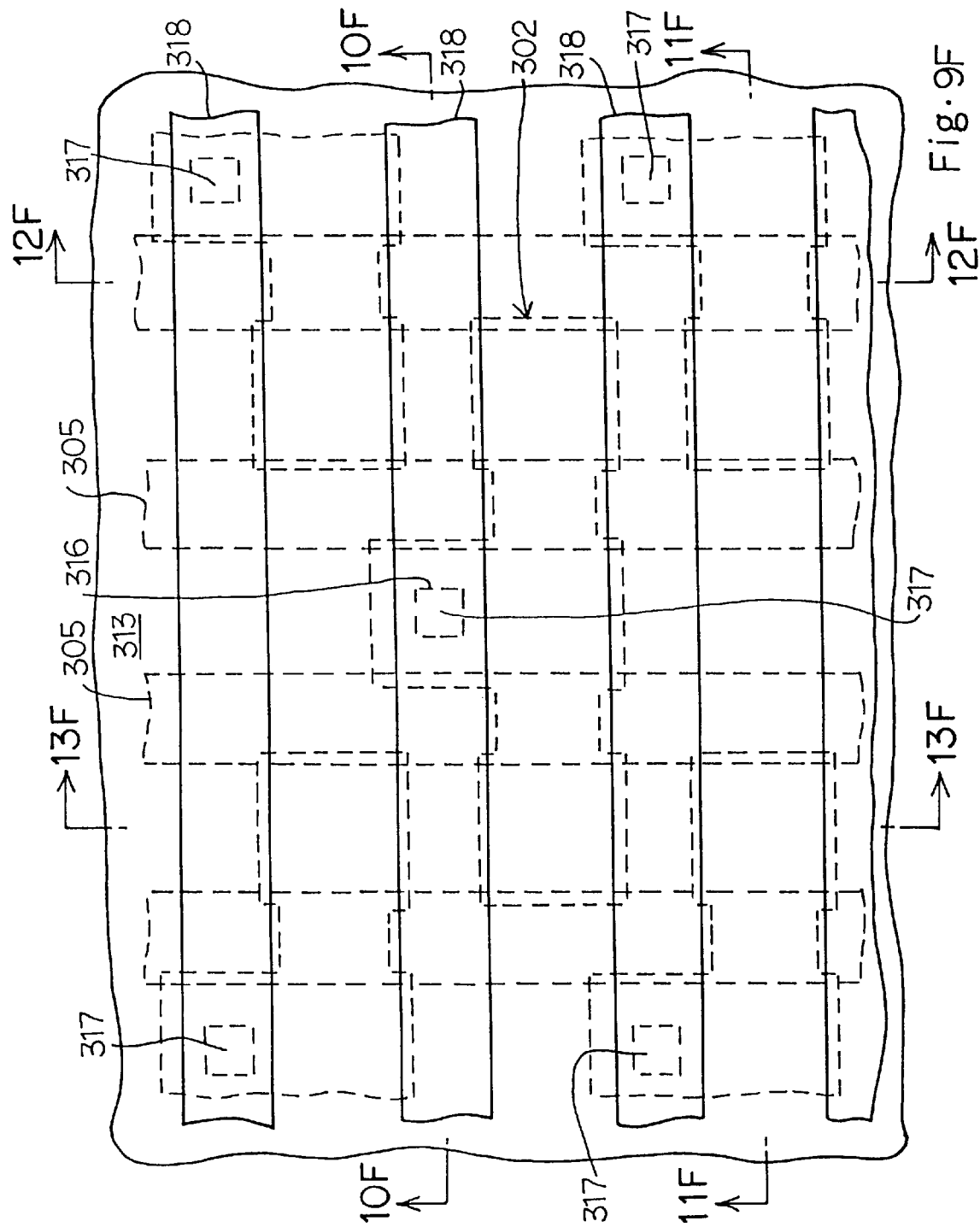
Figure 9I:
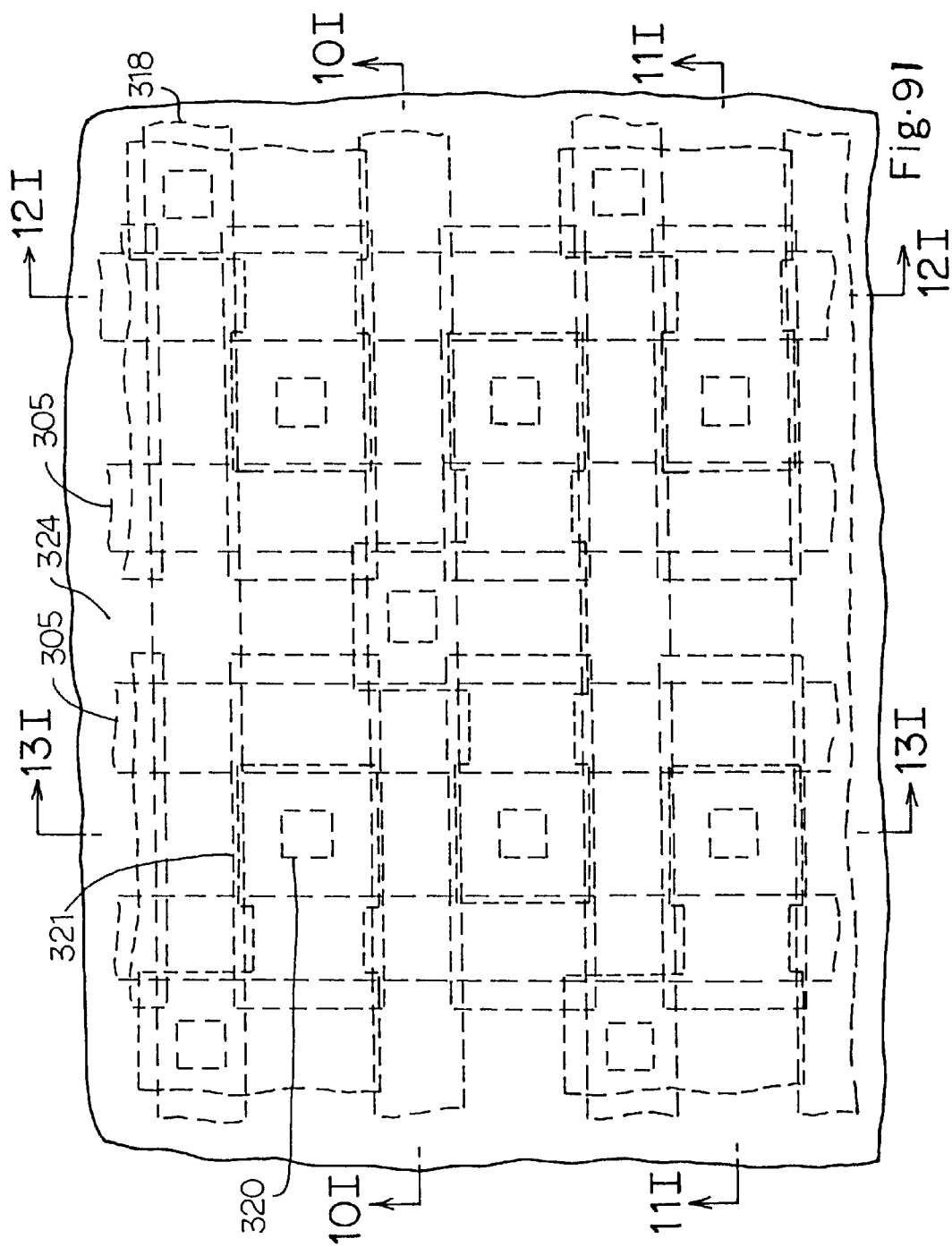
Figure 12C:
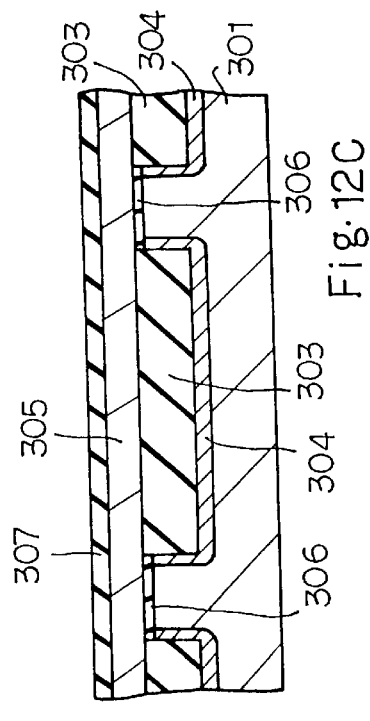
Figure 13C:
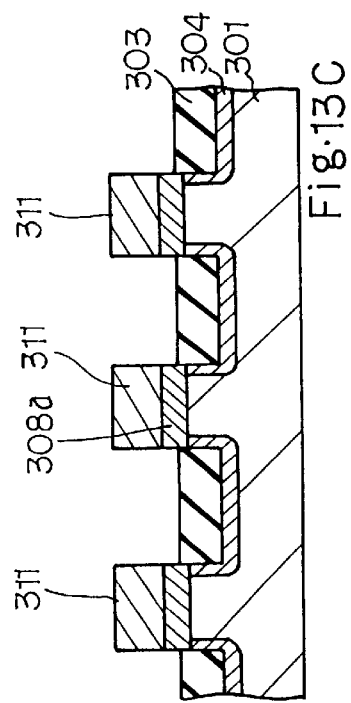
Figure 10C:
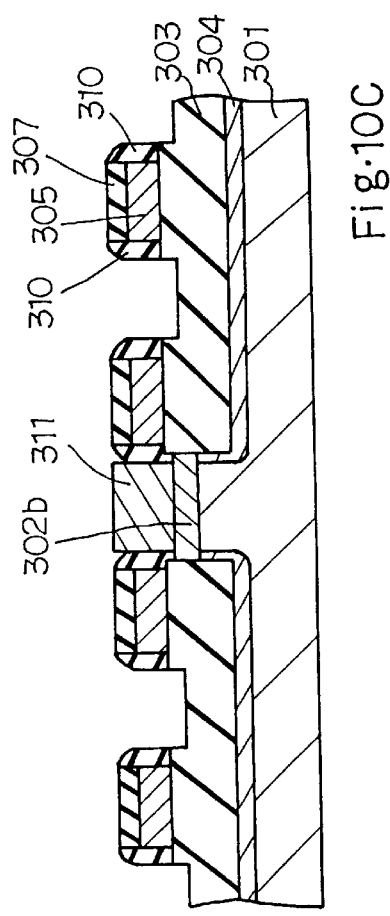
Figure 11C:
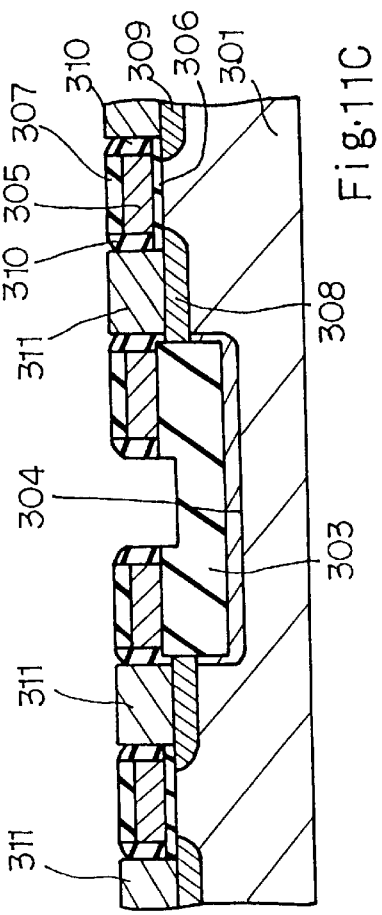
Figure 12E:
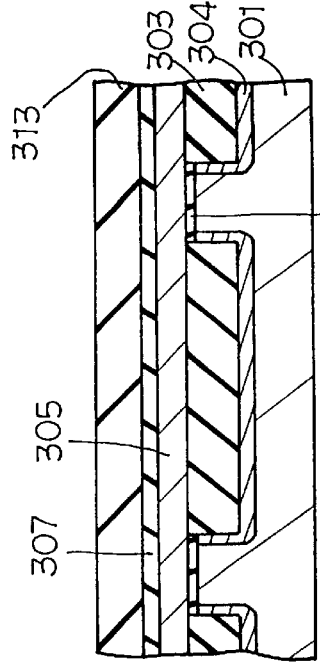
Figure 13E:
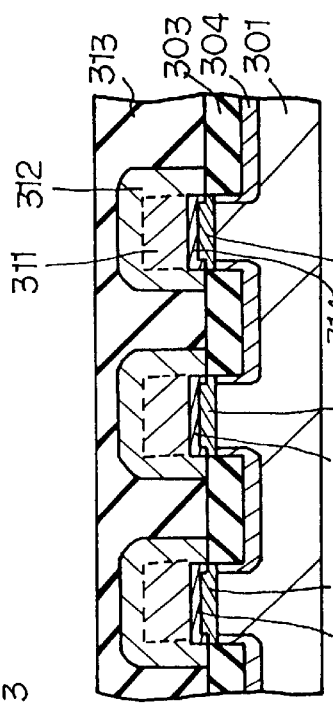
Figure 10E:
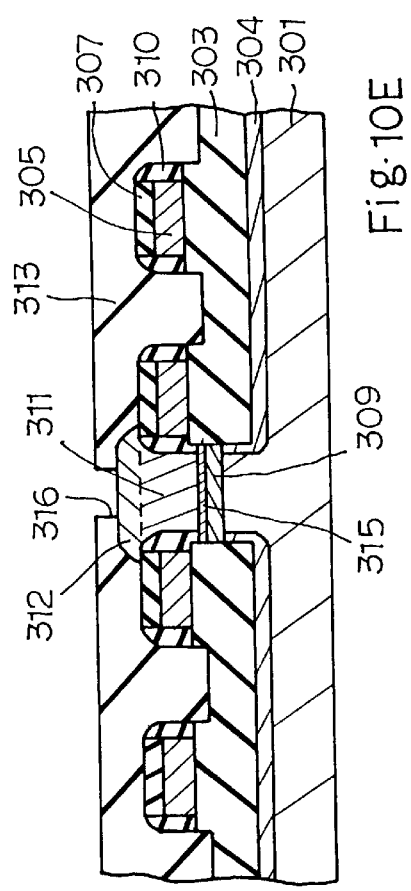
Figure 11E:
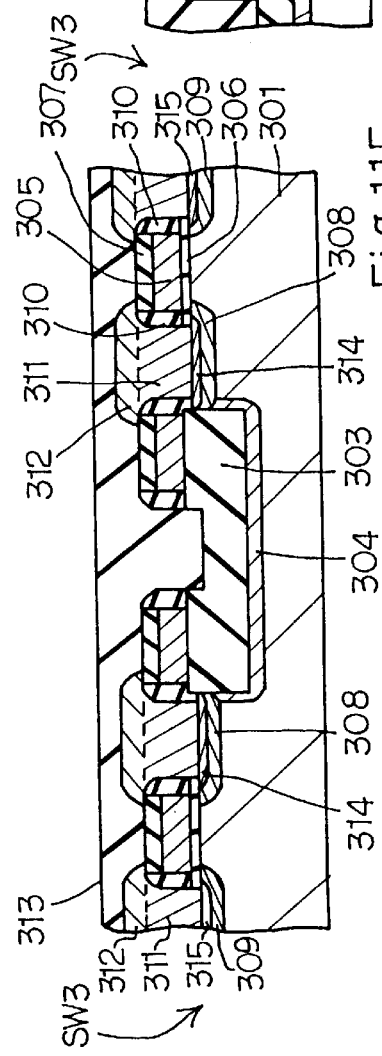
Figure 10G:
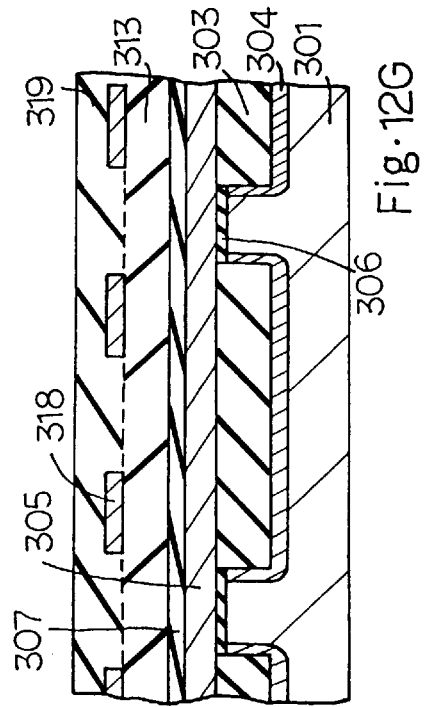
Figure 11G:
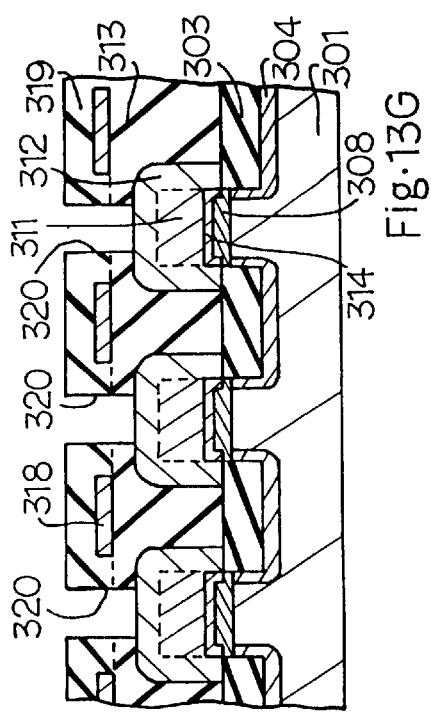
Figure 12G:
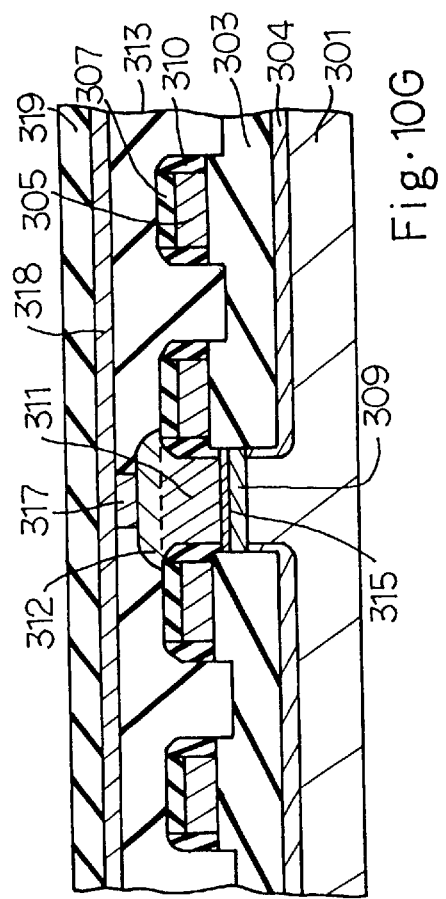
Figure 13G:
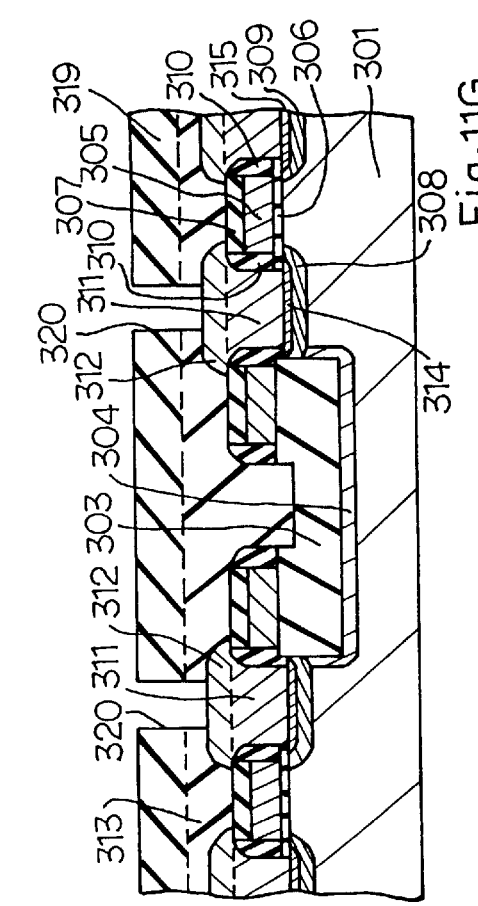
Figure 12H:
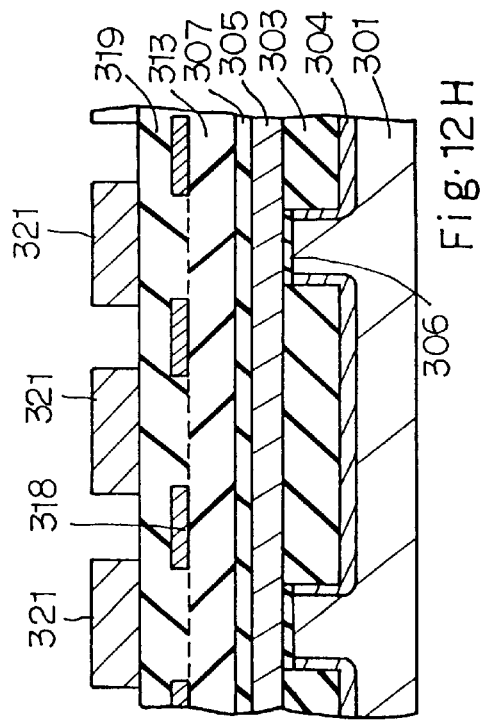
Figure 13H:
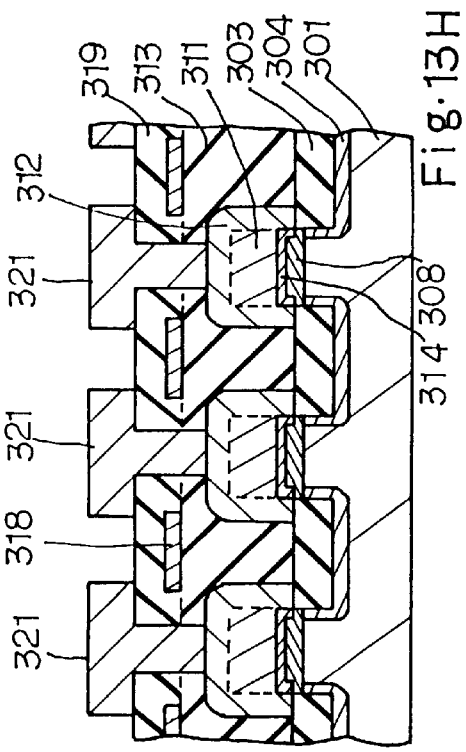
Figure 10H:
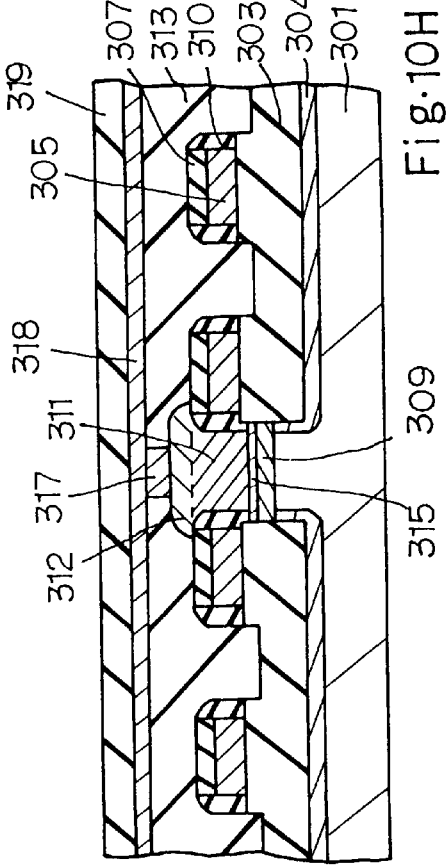
Figure 11H:
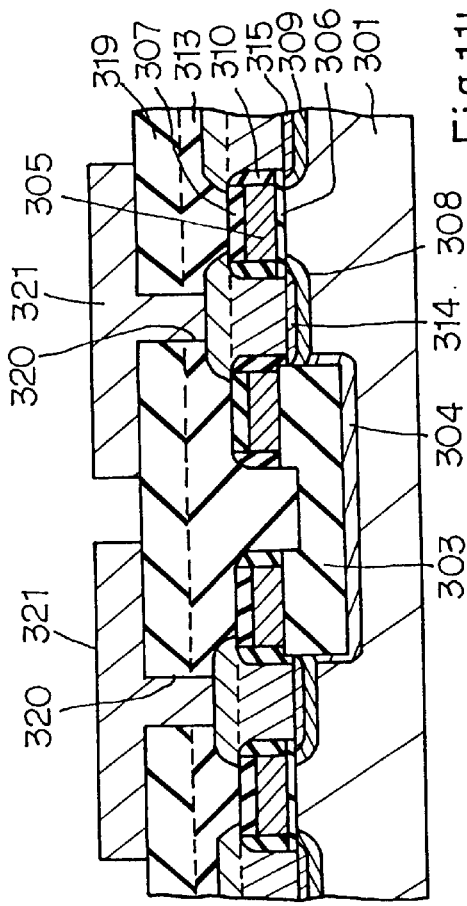

FIGS. 9A to 9I, 10A to 10I, 11A to 11I, 12A to 12I and 13A to 13I illustrate another process sequence for fabricating a semiconductor dynamic random access memory device embodying the present invention. The semiconductor dynamic random access memory device is designed under 0.20 micron rules.

The process starts with preparation of a p-type silicon substrate 301. The p-type silicon substrate 301 has the resistivity of 10 ohm.cm, and the crystal plane (100) forms a major surface of the p-type semiconductor substrate 301. N-type wells and p-type wells are selectively formed in the p-type silicon substrate 301; however, the n-type wells and the p-type wells are not shown in the figures.

A photo-resist etching mask (not shown) is formed on the major surface of the p-type silicon substrate 301 by using the lithographic techniques, and the photo-resist mask covers predetermined areas assigned to active areas, respectively.

Using the photo-resist etching mask, the p-type silicon substrate 301 is selectively etched away by using a reactive ion etching technique, and a trench of 300 nanometers deep is formed in the surface portion of the silicon substrate 301. Boron is obliquely implanted into the p-type silicon substrate 301 around the trench at dose of $5 \times 10^{12}$ cm$^{-2}$ under acceleration energy of 20 KeV. The p-type silicon substrate 301 is rotated during the ion-implantation, and the boron is doped into a surface portion of the p-type silicon substrate 301 defining the trench. The trench defines active areas 302 where pairs of memory cells are respectively assigned. In this instance, the active area 302 has a drain contact area 302b projecting from a rectangular area for source/channel/drain regions. The active areas 302 are oriented in such a manner that all the four edges 302a (see FIG. 9A) are in parallel to crystal direction <110> of the p-type silicon substrate 301.

Silicon oxide is deposited over the entire surface of the resultant semiconductor structure by using a chemical vapor deposition. The silicon oxide fills the trench, and swells into a silicon oxide layer. The silicon oxide layer is chemically mechanically polished so as to expose the active areas 302, again. Then, a buried insulating region 303 is left in the trench.

The resultant semiconductor structure is heated to 850 degrees in centigrade for 30 minutes so as to activate the implanted boron, and lightly-doped p-type punch-through stopper layers 304 are formed beneath the buried insulating region 303. The buried insulating region 303 defines the active areas 302, and the buried insulating region 303 and the active areas 302 are substantially coplanar with each other. The lightly-doped p-type punch-through stopper layer 304 extends along the bottom surface and the side surface of the buried insulating region 303. FIGS. 9A, 10A, 11A, 12A and 13A illustrate the layout on the major surface of the p-type silicon substrate 301 and the resultant semiconductor structure.

Subsequently, silicon oxide is thermally grown to 7.5 nanometers thick on the active areas 202 at 850 degrees in centigrade, and silicon oxide layers are formed on the active areas 202. Phosphorous-doped polysilicon is deposited to 50 nanometers thick over the entire surface of the resultant semiconductor structure at 700 degrees in centigrade by using a chemical vapor deposition, and, thereafter, tungsten silicide is deposited to 100 nanometers thick over the phosphorous-doped polysilicon layer by using a sputtering. Silicon nitride is further deposited to 150 nanometers thick over the tungsten silicide layer by using a chemical vapor deposition, and forms a silicon nitride layer. Thus, the silicon nitride layer and the tungsten silicide layer are laminated on the phosphorous-doped polysilicon layer.

A photo-resist etching mask (not shown) is formed on the silicon nitride layer by using the lithographic techniques, and covers predetermined areas of the silicon nitride layer over word lines 305 to be formed at later stage. Using the photo-resist etching mask, the silicon nitride layer, the tungsten silicide layer, the phosphorous-doped polysilicon layer and the silicon oxide layers are selectively etched away by using a reactive ion etching technique, and gate insulating layers 306, the word lines 305 and silicon nitride caps 307 are patterned on channel regions. Parts of the word lines 305 on the gate insulating layers 306 serve as gate electrodes, respectively, and the gate electrodes are also labeled with reference numeral 305 in the following description.

Using the gate electrodes 305 and the buried insulating region 303 as an ion-implantation mask, phosphorous or arsenic is ion implanted into the active areas 302 at dose of $2 \times 10^{13}$ cm$^{-2}$ under acceleration energy of 30 KeV, and forms lightly doped n-type source region 308 and lightly doped n-type drain regions 309 in the active areas 302.

Silicon oxide is deposited to 50 nanometers thick over the entire surface of the resultant semiconductor structure by using the chemical vapor deposition, and a silicon oxide layer conformably extends over the resultant semiconductor structure. The silicon oxide layer is etched back by using the reactive ion etching without an etching mask, and side wall spacers 310 remain on the side surfaces of the word lines 305 as shown in FIGS. 9B, 10B, 11B, 12B and 13B. While the silicon oxide layer is being etched back, the gate insulating layers 306 on both sides of the side wall spacers 310, and the buried insulating region 303 is partially etched. As a result, the silicon nitride strips 307 are decreased to 100 nanometers thick, and the exposed surface of the buried isolating region 303 becomes lower than the lightly-doped n-type source/drain regions 308/309 by 50 nanometers. Crystal plane (110) forms the side surfaces 308a of the lightly-doped n-type source/drain regions 308/309 (see FIG. 13B).

Subsequently, the resultant semiconductor structure is placed in a reaction chamber (not shown), and first silicon pads 311 are epitaxially grown to 250 nanometers high on the lightly doped n-type source/drain regions 308/309, respectively. The upper surfaces of the first silicon pads 311 are as high as the silicon nitride strips 307 as shown in FIGS. 9C, 10C, 11C, 12C and 13C. The epitaxial growth is carried out under the following conditions. The substrate temperature is 700 degrees in centigrade, and the reaction chamber is regulated to $1 \times 10^{-2}$ Pa. Gaseous mixture is supplied to the reaction chamber, and $Si_2H_6$ is regulated to 1 sccm. $PH_3$ is further mixed into the gaseous mixture. $PH_3$ is diluted in $H_2$ at 1%, and is regulated to 0.1 sccm.

The silicon grown on the crystal plane (100) is more than hundred times faster than the silicon grown on the crystal plane (110). For this reason, the first silicon pads 311 are upwardly grown on the lightly-doped n-type source/drain regions 308/309. However, the epitaxial growth in the lateral direction is a little. The first silicon pads 311 are doped with phosphorous at $1 \times 10^{19}$ cm$^{-3}$. The epitaxial growing conditions are variable depending upon the epitaxial growing system. For this reason, the epitaxial growing conditions are never limited to the above, and are appropriately modified in so far as the silicon pads 311 are anisotropically grown.

Subsequently, second silicon pads 312 are epitaxially grown to 80 nanometers thick on the first silicon pads 311, respectively, under the following conditions. The substrate temperature is 700 degrees in centigrade, and the reaction chamber is regulated to $1 \times 10^{-2}$ Pa. Gaseous mixture is supplied to the reaction chamber, and $Si_2H_6$ is regulated to 10 sccm. $PH_3$ is further mixed into the gaseous mixture. $PH_3$ is diluted in $H_2$ at 1%, and is regulated to 0.1 sccm. The epitaxial growth under the above conditions cause the second silicon pads 312 to be grown on the crystal planes (100) and (110) at certain speed approximately equal therebetween. For this reason, the second silicon pads 312 are isotropically grown from the first silicon pads 311, and the second silicon pads 312 provide contact areas wider than the lightly doped n-type source/drain regions 308/309 as shown in FIGS. 9D, 10D, 11D, 12D and 13D. The second silicon pads 312 are doped with the phosphorous at $1 \times 10^{19}$ cm$^{-3}$. The epitaxial growing conditions are also variable in so far as the epitaxial growth is isotropic.

The word line 305 is 0.20 micron wide or 200 nanometers wide, and two side wall spacers 310 add 100 nanometers to the width of the word line 305. Therefore, the first silicon pad 311 is spaced from the adjacent first silicon pads 311 by 300 nanometers. The second silicon pad 312 laterally projects from the first silicon pad 311 on the silicon nitride strips 307 by 30 nanometers, and is spaced from the adjacent second silicon pad 312 by 140 nanometers. Thus, the second silicon pads 312 are never merged with one another over the silicon nitride strips 307.

The buried isolating region 303 is 250 nanometers wide, and the first silicon pad 311 is also spaced from the adjacent first silicon pad 311 by 250 nanometers. The second silicon pad 312 is spaced from the adjacent second silicon pad 312 by 90 nanometers. Thus, the second silicon pads 312 are never merged with each other on the buried isolating region 303.

In comparison, if a silicon pad is epitaxially grown to 330 nanometers high on the lightly-doped n-type source/drain regions 308/309 under the conditions for the second silicon pad 312 as similar to the prior art, the silicon pads are spaced on the silicon nitride layers 307 by 240 nanometers. However, the silicon pads are merged with one another on the buried isolating region 303.

Silicon oxide and boro-phosphosilicate glass are successively deposited to 100 nanometers thick and 300 nanometers thick over the entire surface of the resultant semiconductor structure, and the boro-phosphosilicate glass layer is reflowed at 800 degrees in centigrade for 10 minutes. The boro-phosphosilicate glass layer is etched back by 200 nanometers thick, and the remaining boro-phosphosilicate glass layer forms a first inter-level insulating layer 313. While the boro-phosphosilicate glass layer is reflowed, the phosphorous is diffused from the first silicon pads 311 into the lightly doped n-type source/drain regions 308/309, and heavily-doped n-type source/drain regions 314/315 are formed in the lightly-doped n-type source/drain regions 308/309, respectively. The lightly/heavily doped source/drain regions 308/309/314/315, the gate insulating layer 306 and the gate electrode 305 form in combination an n-channel enhancement type switching transistor SW3, and the n-channel enhancement type switching transistor SW3 is covered with the first inter-level insulating layer 313.

A photo-resist etching mask (not shown) is formed on the first inter-level insulating layer 313 by using the lithographic techniques, and the first inter-level insulating layer 313 is selectively etched away by using the reactive ion etching technique for forming bit line contact holes 316 as shown in FIGS. 9E, 10E, 11E, 12E and 13E. In the reactive ion etching, gaseous etchant contains $CF_4$ and $CH_2F_2$, and the bit line contacts 316 are open to the second silicon pads 312.

The second silicon pads 312 over the heavily doped n-type drain regions 315 are exposed to the bit line contact holes 316. As described hereinbefore, the second silicon pads 312 have the upper surfaces wider than the heavily doped n-type drain regions 315. The second silicon pad 312 projects on the silicon nitride strips 307 by 30 nanometers. The gaseous etchant selectively etches the silicon oxide and the boro-phosphosilicate glass. However, the silicon nitride is hardly etched by the gaseous etchant. For this reason, even if the bit line contact hole 316 is deviated from the target area, the word line 305 is never exposed to the bit line contact hole 316. In the first embodiment, the nesting tolerance on the buried insulating region 203 is 100 nanometers, and the margin for the gate electrode 205 is only 50 nanometers. On the other hand, the margin for the gate electrode 305 is increased to 130 nanometers in so far as the second silicon pads 312 are spaced from each other, because it is acceptable that a half of the bit line contact hole is on the second silicon pad 312.

Subsequently, phosphorous-doped polysilicon is deposited to 150 nanometers thick at 700 degrees in centigrade by using the chemical vapor deposition. The phosphorous-doped polysilicon fills the bit line contact holes 316, and swells into a phosphorous-doped polysilicon layer extending on the first inter-level insulating layer 313. The phosphorous-doped polysilicon layer is etched back until the first inter-level insulating layer 313 is exposed again. Thus, the bit line contact holes 316 are plugged with doped polysilicon layers 317.

Subsequently, tungsten silicide is deposited to 100 nanometers thick over the entire surface of the resultant semiconductor structure. A photo-resist etching mask is formed on the tungsten silicide layer by using the lithographic techniques, and the tungsten silicide layer is patterned into bit lines 318 by using the reactive ion etching as shown in FIGS. 9F, 10F, 11F, 12F and 13F.

Silicon oxide and boro-phosphosilicate glass are successively deposited to the total thickness of 300 nanometers, and are treated with heat at 800 degrees in centigrade for 10 minutes. Thus, a second inter-level insulating layer 319 covers the bit lines 318. A photo-resist etching mask (not shown) is formed on the second inter-level insulating layer 319 by using the lithographic techniques, and the second inter-level insulating layer 319 and the first inter-level insulating layer 313 are selectively etched away by using the reaction ion etching techniques so as to form node contact holes 320 as shown in FIGS. 9G, 10G, 11G, 12G and 13G.

Subsequently, phosphorous-doped polysilicon is deposited to 800 nanometers thick over the entire surface of the resultant semiconductor structure by using the chemical vapor deposition at 700 degrees in centigrade, and a photo-resist etching mask (not shown) is formed on the phosphorous-doped polysilicon layer by using the lithographic techniques. Using the photo-resist etching mask, the phosphorous-doped polysilicon layer is selectively etched away by using the reactive ion etching technique so as to form storage node electrodes 321 as shown in FIGS. 9H, 10H, 11H, 12H and 13H.

Tantalum oxide is deposited over the entire surface of the resultant semiconductor structure by using a chemical vapor deposition, and the tantalum oxide layer is equivalent to a silicon oxide layer of 2.5 nanometers thick. The tantalum oxide layer is oxidized at 800 degrees in centigrade for 1 minute so as to form a dielectric film 322.

Titanium nitride is deposited over the entire surface of the resultant semiconductor structure by using a sputtering technique, and a photo-resist etching mask (not shown) is formed on the titanium nitride layer. Using the photo-resist etching mask, the titanium nitride layer is selectively etched away by using a reactive ion etching so as to form a plate electrode 323. The plate electrode 323 extends over the memory cells shown in FIG. 9I, and the boundary is not shown.

Finally, silicon oxide is deposited over the entire surface of the resultant semiconductor structure, and forms a third inter-level insulating layer 324. The resultant semiconductor structure is illustrated in FIGS. 9I, 10I, 11I, 12I and 13I. The storage node electrode 321, the dielectric film 322 and the plate electrode 323 as a whole constitute a storage capacitor CP3.

The process described hereinbefore also achieves all the advantages of the first embodiment.

As will be appreciated from the foregoing description, the first silicon pads 211/311 are grown over the heavily doped n-type source/drain regions 214/215/314/315 without substantial lateral growth, and the second silicon pads 211/312 are isotropically grown from the first silicon pads 211/311 so as to increase the contact areas. As a result, the nesting tolerance between the node/bit contact hole and the second silicon pad is increased without short-circuit between the adjacent second silicon pads.

Although particular embodiments of the present invention have been shown and described, it will be obvious to those skilled in the art that various changes and modifications may be made without departing from the spirit and scope of the present invention.

For example, the present invention is applicable to any kind of semiconductor device in so far as a nesting tolerance is tight. The first silicon layers may be slightly lower than the side wall spacers or slightly higher than the side wall spacers in so far as the second silicon layers are never merged with each other on the buried isolating region.

The active areas may be isolated by a field oxide grown by using the LOCOS process.

What is claimed is:

1. A process for fabricating a semiconductor device comprising the steps of:
   a) forming a plurality of semiconductor areas spaced from each other by an insulating region, formed by a first crystal plane allowing first semiconductor layers to be grown faster than a second crystal plane perpendicular to said first crystal plane and higher than said insulating region so as to expose side surfaces of said second crystal plane;
   b) forming a plurality of insulating walls on said insulating region so that said semiconductor areas are exposed to a gap therebetween;
   c) anisotropically growing said first semiconductor layers from said plurality of semiconductor areas in such a manner as to have a first growing speed in a direction perpendicular to said plurality of semiconductor areas larger than a second growing speed in a direction parallel to said plurality of semiconductor areas;
   d) isotropically growing second semiconductor layers from said first semiconductor layers in such a manner as to equalize said first growing speed to said second growing speed for extending said second semiconductor layers on upper surfaces of said plurality of insulating walls; and
   e) completing said semiconductor device.

2. The process as set forth in claim 1, in which said first semiconductor layers and said second semiconductor layers are silicon, and said first crystal plane and said second crystal plane are (100) and (110).

3. The process as set forth in claim 1, in which said step a) includes the sub-steps of
   a-1) preparing a semiconductor substrate having a major surface,
   a-2) selectively forming said insulating region in said major surface so as to define a plurality of active areas of said first crystal plane in said major surface, a-3) forming gate insulating layers on said plurality of active areas, a-4) forming gate electrodes on said gate insulating layers, a-5) introducing dopant impurity into said plurality of active areas so as to form said plurality of semiconductor areas in a self-aligned manner with said gate electrodes, a-6) depositing an insulating layer over the entire surface of the resultant semiconductor structure of said step a-5), and a-7) etching said insulating layer and a surface portion of said insulating region so as to form said plurality of insulating walls on side surfaces of said gate electrodes and expose said side surfaces of said plurality of semiconductor areas formed by said second crystal plane.

4. The process as set forth in claim 3, in which said semiconductor substrate is formed of silicon, and said first crystal plane allows said first semiconductor layers of silicon to be grown faster than said second crystal plane.

5. The process as set forth in claim 4, in which said first crystal plane and said second crystal plane are (100) and (110).

6. The process as set forth in claim 5, in which said first semiconductor layers are grown under the conditions where $Si_2H_6$ gas is supplied at a first flow rate to said semiconductor substrate at a predetermined temperature in a predetermined vacuum, and said second semiconductor layers are grown under the conditions where $Si_2H_6$ gas is supplied at a second flow rate larger than said first flow rate to said semiconductor substrate at said predetermined temperature in said predetermined vacuum.

7. The process as set forth in claim 6, in which said first flow rate and said second flow rate are 1 sccm and 10 sccm, respectively, and said predetermined temperature and said predetermined vacuum are 700 degrees in centigrade and $1 \times 10^{-2}$ Pa, respectively.

8. The process as set forth in claim 7, in which $PH_3$ gas diluted in $H_2$ gas at 1% is mixed into said $Si_2H_6$ gas.

9. The process as set forth in claim 3, in which said gate insulating layer and said gate electrode form parts of a field effect transistor, and said field effect transistor forms a dynamic random access memory cell together with a storage capacitor connected through one of said first semiconductor layers and one of said second semiconductor layers to said field effect transistor.

10. A process of fabricating a semiconductor device comprising the steps of a) forming an isolating layer in a silicon substrate of a first conductivity type so as to define an active area of a first crystal plane of silicon, a second crystal plane of silicon being perpendicular to an edge line defining a part of said active area, b) forming a gate insulating layer on said active area, c) depositing a first conductive layer and a first insulating layer over said gate insulating layer, d) patterning said first conductive layer and said first insulating layer into an encapsulated gate electrode on said gate insulating layer, e) depositing a second insulating layer over the entire surface of the resultant structure of said step d), f) etching said second insulating layer and a surface portion of said isolating region without an etching mask so as to form side wall spacers on said encapsulated gate electrode and expose side surfaces of said second crystal plane, g) growing first silicon layers of a second conductivity type from said active area on outer sides of said side wall spacers in a direction perpendicular to said first crystal plane under the epitaxial growing conditions where said first silicon layers are grown from said first crystal plane faster than said second crystal plane until said first silicon layers becomes as high as said encapsulated gate electrode, h) growing second silicon layers of said second conductivity type from said first silicon layers under isotropic epitaxial growing conditions so as to extend on said encapsulated gate electrode and said isolating region, i) covering said second silicon layers and said encapsulated gate electrode with a first inter-level insulating layer, j) forming a first contact hole in said first inter-level insulating layer so as to expose one of said second silicon layers, k) forming a second conductive layer held in contact through said first contact hole with said one of said second silicon layers, l) covering said second conductive layer and said first inter-level insulating layer with a second inter-level insulating layer, m) forming a second contact hole in said second inter-level insulating layer and said first inter-level insulating layer so as to expose another of said second silicon layers, and n) forming a third conductive layer held in contact through said second contact hole with said another of said second silicon layers.

11. A process of fabricating a semiconductor device comprising the steps of a) forming an isolating layer in a silicon substrate of a first conductivity type so as to define an active area of a first crystal plane of silicon, a second crystal plane of silicon being perpendicular to an edge line defining a part of said active area, b) forming a gate insulating layer on said active area, c) depositing a first conductive layer and a first insulating layer over said gate insulating layer, d) patterning said first conductive layer and said first insulating layer into an encapsulated gate electrode on said gate insulating layer, e) depositing a second insulating layer over the entire surface of the resultant structure of said step d), f) etching said second insulating layer and a surface portion of said isolating region without an etching mask so as to form side wall spacers on said encapsulated gate electrode and expose side surfaces of said second crystal plane, g) growing first silicon layers of a second conductivity type from said active area on outer sides of said side wall spacers in a direction perpendicular to said first crystal plane under the epitaxial growing conditions where said first silicon layers are grown from said first crystal plane faster than said second crystal plane until said first silicon layers becomes as high as said encapsulated gate electrode, h) growing second silicon layers of said second conductivity type from said first silicon layers under isotropic epitaxial growing conditions so as to extend on said encapsulated gate electrode and said isolating region, i) covering said second silicon layers and said encapsulated gate electrode with a first inter-level insulating layer, j) forming a first contact hole in said first inter-level insulating layer so as to expose one of said second silicon layers, k) depositing a second conductive layer held in contact through said first contact hole with said one of said second silicon layers, l) patterning said second conductive layer into a storage node electrode, m) covering said storage node electrode with a dielectric film, n) depositing a third conductive layer on said dielectric film, o) patterning said third conductive layer into a plate electrode, p) covering the resultant structure of said step o) with a second inter-level insulating layer, q) forming a second contact hole in said second inter-level insulating layer and said first inter-level insulating layer so as to expose another of said second silicon layers, r) depositing a fourth conductive layer on said second inter-level insulating layer so as to be held in contact through said second contact hole with said another of said second silicon layers, and s) patterning said fourth conductive layer into a bit line.

12. A process of fabricating a semiconductor device comprising the steps of a) forming an isolating layer in a silicon substrate of a first conductivity type so as to define an active area of a first crystal plane of silicon, a second crystal plane of silicon being perpendicular to an edge line defining a part of said active area, b) forming a gate insulating layer on said active area, c) depositing a first conductive layer and a first insulating layer over said gate insulating layer, d) patterning said first conductive layer and said first insulating layer into an encapsulated gate electrode on said gate insulating layer, e) depositing a second insulating layer over the entire surface of the resultant structure of said step d), f) etching said second insulating layer and a surface portion of said isolating region without an etching mask so as to form side wall spacers on said encapsulated gate electrode an expose side surfaces of said second crystal plane, g) growing first silicon layers of a second conductivity type from said active area on outer sides of said side wall spacers in a direction perpendicular to said first crystal plane under the epitaxial growing conditions where said first silicon layers are grown from said first crystal plane faster than said second crystal plane until said first silicon layers becomes as high as said encapsulated gate electrode, h) growing second silicon layers of said second conductivity type from said first silicon layers under isotropic epitaxial growing conditions so as to extend on said encapsulated gate electrode and said isolating region, i) covering said second silicon layers and said encapsulated gate electrode with a first inter-level insulating layer, j) forming a first contact hole in said first inter-level insulating layer so as to expose one of said second silicon layers, k) depositing a second conductive layer held in contact through said first contact hole with said one of said second silicon layers, l) patterning said second conductive layer into a bit line, m) covering the resultant structure of said step l) with a second inter-level insulating layer, n) forming a second contact hole in said second inter-level insulating layer and said first inter-level insulating layer so as to expose another of said second silicon layers, o) depositing a third conductive layer on said second inter-level insulating layer so as to be held in contact through said second contact hole with said another of said second silicon layers, p) patterning said third conductive layer into a storage node electrode, q) covering said storage node electrode with a dielectric layer, r) depositing a fourth conductive layer over said dielectric layer, and s) patterning said fourth conductive layer into a plate electrode.

* * * * *